(12) United States Patent
Zhang et al.

(10) Patent No.: US 12,484,394 B2
(45) Date of Patent: Nov. 25, 2025

(54) DISPLAY SUBSTRATE WITH DATA FANOUT LINES, PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhenhua Zhang, Beijing (CN); Yingsong Xu, Beijing (CN); Benlian Wang, Beijing (CN); Yuxin Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 953 days.

(21) Appl. No.: 17/636,369

(22) PCT Filed: Apr. 30, 2021

(86) PCT No.: PCT/CN2021/091499
§ 371 (c)(1),
(2) Date: Feb. 18, 2022

(87) PCT Pub. No.: WO2022/227005
PCT Pub. Date: Nov. 3, 2022

(65) Prior Publication Data
US 2023/0354655 A1 Nov. 2, 2023

(51) Int. Cl.
*H10K 59/131* (2023.01)
*H10K 59/12* (2023.01)
(52) U.S. Cl.
CPC ....... *H10K 59/131* (2023.02); *H10K 59/1201* (2023.02)

(58) Field of Classification Search
CPC ................ H10K 59/131; H10K 59/1201
See application file for complete search history.

(56) References Cited

U.S. PATENT DOCUMENTS

2007/0291042 A1   12/2007   Kwak et al.
2014/0117320 A1   5/2014   Jung
(Continued)

FOREIGN PATENT DOCUMENTS

CN     101093303 A    12/2007
CN     202120015 U    1/2012
(Continued)

OTHER PUBLICATIONS

Office Action dated Oct. 23, 2024 for Chinese Patent Application No. 202180001059.0 and English Translation.
European Search Report for 21938479.9 Mailed Sep. 25, 2023.

*Primary Examiner* — Lex H Malsawma
(74) *Attorney, Agent, or Firm* — Ling Wu; Stephen Yang; Ling and Yang Intellectual Property

(57) ABSTRACT

A display substrate, a manufacturing method thereof and a display device. The display substrate includes a display region and a bonding area located at a side of the display region, the bonding area at least includes a lead area; the display region includes multiple data lines and multiple data fanout lines, and the lead area includes multiple lead wires; at least one lead wire is connected with the data line through the data fanout line. In a plane perpendicular to the display substrate, the display substrate includes a first conductive layer, a second conductive layer, a third conductive layer and a fourth conductive layer, and insulating layers are arranged between the first conductive layer and the second conductive layer, the second conductive layer and the third conductive layer, the third conductive layer and the fourth conductive layer. The data lines and data fanout lines are arranged in different conductive layers.

14 Claims, 20 Drawing Sheets

(56) References Cited

U.S. PATENT DOCUMENTS

| | | |
|---|---|---|
| 2016/0300863 A1* | 10/2016 | Koide .................... H10D 86/60 |
| 2017/0309644 A1 | 10/2017 | Yeh |
| 2017/0365808 A1 | 12/2017 | Lee et al. |
| 2020/0090559 A1* | 3/2020 | Song .................... H10K 59/121 |
| 2020/0342791 A1 | 10/2020 | Song et al. |
| 2020/0388230 A1 | 12/2020 | Lee |
| 2021/0013287 A1 | 1/2021 | Bang et al. |
| 2021/0027717 A1 | 1/2021 | Kim |
| 2021/0043134 A1 | 2/2021 | Cho et al. |
| 2021/0083036 A1 | 3/2021 | Kang et al. |
| 2021/0336107 A1 | 10/2021 | Jiang et al. |

FOREIGN PATENT DOCUMENTS

| | | |
|---|---|---|
| CN | 106057820 A | 10/2016 |
| CN | 107123634 A | 9/2017 |
| CN | 107305757 A | 10/2017 |
| CN | 107527935 A | 12/2017 |
| CN | 108447887 A | 8/2018 |
| CN | 109491121 A | 3/2019 |
| CN | 111312090 A | 6/2020 |
| CN | 112038367 A | 12/2020 |
| CN | 112051691 A | 12/2020 |
| CN | 112054038 A | 12/2020 |
| CN | 112310125 A | 2/2021 |
| CN | 112310150 A | 2/2021 |
| CN | 112510066 A | 3/2021 |

\* cited by examiner

DISPLAY SUBSTRATE WITH DATA FANOUT LINES, PREPARATION METHOD THEREOF, AND DISPLAY APPARATUS

CROSS-REFERENCE TO RELATED APPLICATION

The present application is a U.S. National Phase Entry of International Application No. PCT/CN2021/091499 having an international filing date of Apr. 30, 2021, the entire content of which is hereby incorporated by reference.

TECHNICAL FIELD

Embodiments of the present disclosure relate to, but are not limited to, the field of display technology, in particular to a display substrate and a preparation method thereof, and a display apparatus.

BACKGROUND

An Organic Light Emitting Diode (OLED) is an active light emitting display device, which has the advantages of self-luminescence, wide angle of view, high contrast, low power consumption, extremely high response speed and so on. With the constant development of display technology, a display apparatus that adopts an OLED as a light emitting device and adopts a Thin Film Transistor (TFT) for signal control has become a mainstream product in the field of display at present.

SUMMARY

The below is a summary about the subject matter described in the present disclosure in detail. The summary is not intended to limit the scope of protection of the claims.

An embodiment in the present disclosure provides a display substrate, which includes a display region and a bonding region on a side of the display region, wherein the bonding region at least includes a lead area; the display region includes a plurality of data lines and a plurality of data fanout lines, and the lead area includes a plurality of lead wires; and at least one lead wire is connected with a data line through a data fanout line;
  in a plane perpendicular to the display substrate, the display substrate includes a first conductive layer, a second conductive layer, a third conductive layer and a fourth conductive layer, and insulating layers are arranged between the first conductive layer and the second conductive layer, between the second conductive layer and the third conductive layer, between the third conductive layer and the fourth conductive layer; and the data lines and the data fanout lines are arranged in different conductive layers.

In an exemplary embodiment, at least one data fanout line includes a first line segment and a second line segment; a first end of the first line segment is connected with a lead wire, and a second end of the first line segment extends in a direction away from the lead area, and then is connected to a first end of the second line segment; and a second end of the second line segment extends in a direction towards the lead area, and then is connected to a data line through a via.

In an exemplary embodiment, the first line segment is parallel to the first direction, a first included angle is formed between the second line segment and the first direction, and the first included angle is 20° to 70°.

In an exemplary embodiment, the second line segment includes an extending segment and a connecting segment; a first end of the extending segment is located in the display region, and is connected to the second end of the first line segment, and a second end of the extending segment extends to an edge of the display region in a direction towards the lead area, and then is connected to a first end of the connecting segment; and a second end of the connecting segment extends in a direction away from the display region, and then is connected to a data line through a via, the data line extending to the lead area; and the edge of the display region is an edge on a side, close to the lead area, of the display region.

In an exemplary embodiment, the display region further includes a first power supply line and a plate connection line, wherein the first power supply line extends along the first direction and the plate connection line extends along the second direction; and the second direction crosses the first direction.

The extending segment includes M1 first sub-line segments and M1 second sub-line segments, wherein M1 is a natural number greater than or equal to 1; the first sub-line segments and the second sub-line segments are alternately connected, a first sub-line segment located at one side of the extending segment is connected with the first line segment, and a second sub-line segment located at the other side of the extending segment is connected with the connecting segment. Orthographic projections of the first line segment and the second sub-line segment on the display substrate plane overlap with an orthographic projection of the first power supply line on the display substrate plane, and an orthographic projection of the first sub-line segment on the display substrate plane overlaps with an orthographic projection of the plate connection line on the display substrate plane.

In an exemplary embodiment, the display region further includes a first power supply line and a plate connection line; the first power supply line extends along a first direction; a second included angle is formed between the plate connection line and the first direction; and the second included angle is 20° to 70°.

The extending segment includes M1 first sub-line segments and M1 second sub-line segments, wherein M1 is a natural number greater than or equal to 1; the first sub-line segments and the second sub-line segments are alternately connected, a first sub-line segment located at one side of the extending segment is connected with the first line segment, a the second sub-line segment located at the other side of the extending segment is connected with the connecting segment. Orthographic projections of the first line segment and the second sub-line segment on the display substrate plane both overlap with an orthographic projection of the first power supply line on the display substrate plane, and an orthographic projection of the first sub-line segment on the display substrate plane overlaps with an orthographic projection of the plate connection line on the display substrate plane.

In an exemplary embodiment, the plate connection line is located in the second conductive layer, the first power supply line is located in the third conductive layer, and the data fanout line is located in the fourth conductive layer.

In an exemplary embodiment, the display region further includes a first power supply line, an initial signal line and a plate connection line, wherein the first power supply line extends along a first direction and the initial signal line and the plate connection line both extend along a second direction; and the second direction crosses the first direction.

The extending segment includes M1 first sub-line segments and M1 second sub-line segments, wherein M1 is a natural number greater than or equal to 1; the first sub-line segments and the second sub-line segments are alternately connected, a first sub-line segment located at one side of the extending segment is connected with the first line segment, and a second sub-line segment located at the other side of the extending segment is connected with the connecting segment. Orthographic projections of the first line segment and the second sub-line segment on the display substrate plane both overlap with an orthographic projection of the first power supply line on the display substrate plane, and an orthographic projection of the first sub-line segment on the display substrate plane overlaps with an orthographic projection, on the display substrate plane, of any one of the following: the initial signal line and the plate connection line.

In an exemplary embodiment, the display region further includes a first power supply line, an initial signal line and a plate connection line, wherein the first power supply line extends along a first direction, and a second included angle is formed between the initial signal line and the first direction and is formed between the plate connection line and the first direction, and the second included angle is 20° to 70°.

The extending segment includes M1 first sub-line segments and M1 second sub-line segments, wherein M1 is a natural number greater than or equal to 1; the first sub-line segments and the second sub-line segments are alternately connected, a first sub-line segment located at one side of the extending segment is connected with the first line segment, and a second sub-line segment located at the other side of the extending segment is connected with the connecting segment. Orthographic projections of the first line segment and the second sub-line segment on the display substrate plane both overlap with an orthographic projection of the first power supply line on the display substrate plane, and an orthographic projection of the first sub-line segment on the display substrate plane overlaps with an orthographic projection, on the display substrate plane, of any one of the following: the initial signal line and the plate connection line.

In an exemplary embodiment, both the initial signal line and the plate connection line are located in the second conductive layer, the first power supply line is located in the third conductive layer, and the data fanout line is located in the fourth conductive layer.

In an exemplary embodiment, a plurality of lead wires in the lead region have the same width along a second direction, and a spacing between adjacent lead wires along a second direction is the same.

In an exemplary embodiment, a plurality of lead wires of the lead area include a first lead group and a second lead group, and lead wires of the first lead group and lead wires of the second lead group are alternately arranged along the second direction.

The plurality of lead wires in the first lead group are correspondingly connected with the data lines through the plurality of the data fanout lines, and the plurality of lead wires in the second lead group are directly connected with the data lines correspondingly.

An embodiment of the present disclosure further provides a display apparatus, including the display substrate as described in any of the above.

An embodiment of the present disclosure also provides a preparation method for a display substrate; the display substrate includes a display region and a bonding region on a side of the display region, the bonding region at least including a lead area; the preparation method includes the following operations: forming a plurality of data lines and a plurality of data fanout lines in the display region, and forming a plurality of lead wires in the lead area; wherein at least one lead wire is connected with a data line through a data fanout line; in a plane perpendicular to the display substrate, the display substrate includes a first conductive layer, a second conductive layer, a third conductive layer and a fourth conductive layer, and insulating layers are arranged between the first conductive layer and the second conductive layer, between the second conductive layer and the third conductive layer, between the third conductive layer and the fourth conductive layer; the data lines and data fanout lines are arranged in different conductive layers.

On reading the drawings and the detailed descriptions, the other aspects may be understood.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure but not intended to form limits to the technical solutions of the present disclosure. The shapes and sizes of each component in the drawings do not reflect the true scale, but are only intended to schematically describe the contents of the present disclosure.

FIG. 21b is a sectional view taken along a direction A-A in FIG. 21a.

FIG. 22b is a sectional view taken along a direction A-A in FIG. 22a.

FIG. 23b is a sectional view taken along a direction A-A in FIG. 23a.

FIG. 24b is a sectional view taken along a direction A-A in FIG. 24a.

FIG. 25b is a sectional view taken along a direction A-A in FIG. 25a.

FIG. 26b is a sectional view taken along a direction A-A in FIG. 26a.

FIG. 27b is a sectional view taken along a direction A-A in FIG. 27a.

FIG. 28b is a sectional view taken along a direction A-A in FIG. 28a.

DETAILED DESCRIPTION

Figure 1:
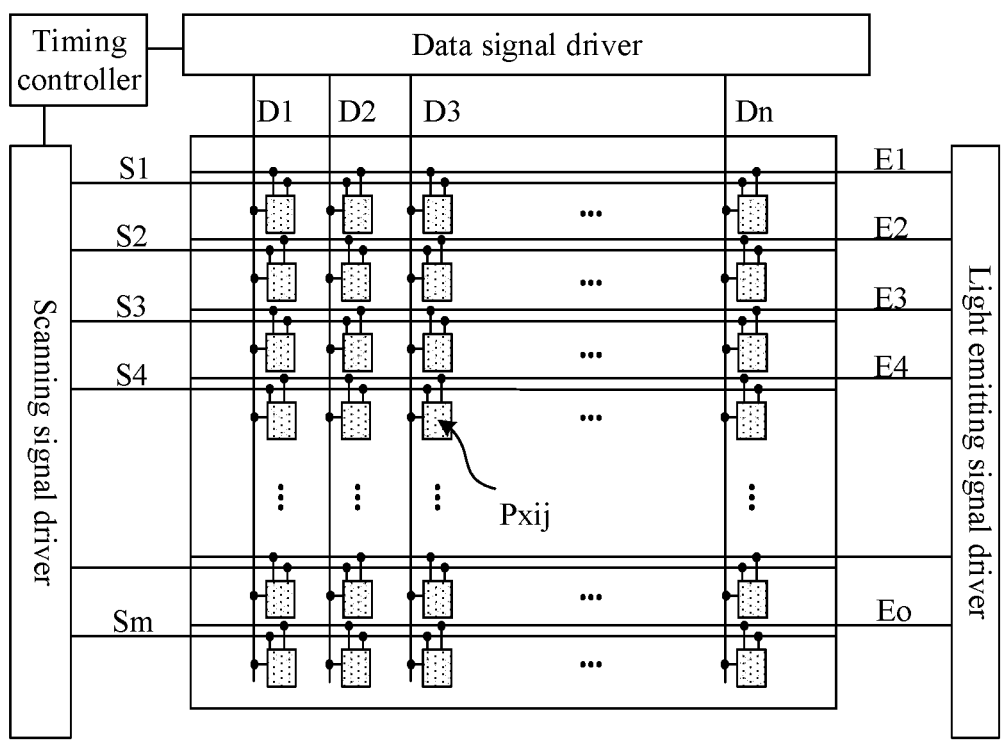
FIG. 1 illustrates a schematic diagram of a structure of a display apparatus.

To make the objects, technical solutions and advantages of the present disclosure more clear, embodiments of the present disclosure will be described in detail below with reference to the drawings. It is to be noted that implementations may be implemented in various forms. Those of ordinary skill in the art can easily understand such a fact that manners and contents may be transformed into various forms without departing from the essence and scope of the present disclosure. Therefore, the present disclosure should not be explained as being limited to the contents recorded in the following implementations only. The embodiments in the present disclosure and the features in the embodiments can be freely combined without conflicts. For keeping the following description of the embodiments of the disclosure clear and concise, detailed descriptions about part of known functions and known components are omitted in the disclosure. The accompanying drawings of the embodiments of the present disclosure only involve the structures involved in the embodiments of the present disclosure, and the other structures may refer to conventional designs.

In the drawings, sometimes for clarity, sizes of various constituent elements, a thickness of a layer or an area may be exaggerated. Therefore, a mode of the present disclosure is not always limited to the size, and shapes and sizes of various component in the drawings do not reflect the true scale. In addition, the drawings schematically illustrate ideal examples, and a mode of the present disclosure is not limited to the shapes, numerical values, or the like shown in the drawings.

"First", "second", "third" and other ordinal numerals in the specification are set to avoid the confusion of the constituent elements, rather than to limit the quantity.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the referred device or element must have a specific orientation or be constructed and operated in a specific orientation, so they should not be understood as limitations to the present disclosure. The position relationship between the constituent elements may be appropriately varied according to the direction of the described constituent elements. Therefore, appropriate replacements based on situations are allowed, not limited to the expressions in the specification.

Unless otherwise specified and limited, in the specification the terms "mount", "connected" and "connect" should be understood in a broad sense. For example, it may be fixed connection, removable connection, or integrated connection; it may be mechanical connection or electrical connection; it may be direct connection, indirect connection through an intermediate component, or communication inside two components. For those skilled in the art, the specific meanings of the above terms in the present disclosure can be understood according to the actual situation.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the present specification, the channel region refers to a main region that the current flows through.

In the present specification, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification.

In this specification, an "electrical connection" includes a case where constituent elements are connected together through an element with a certain electric action. "The element with the certain electric action" is not particularly limited as long as electric signals between the connected composition elements may be sent and received. Examples of "the element with the certain electric action" not only include an electrode and wire, but also include a switch element (such as a transistor), a resistor, an inductor, a capacitor, other elements with various functions, etc.

In the specification, "parallel" refers to a state in which an angle formed by two straight lines is greater than −10° and less than 10°. Thereby, it also includes a state in which an angle is greater than −5° and less than 5°. In addition, "vertical" refers to a state in which an angle formed by two straight lines is greater than 80° and less than 100°. Therefore, it also includes a state in which an angle is greater than 85° and less than 95°.

In this specification, "film" and "layer" may be interchangeable. For example, sometimes "conducting layer" may be replaced by "conducting film". Similarly, sometimes "insulating film" may be replaced by "insulating layer".

In the present disclosure, "about" refers to that a boundary is defined not so strictly and numerical values in process and measurement error ranges are allowed.

FIG. 1 illustrates a schematic diagram of a structure of a display apparatus. As shown in FIG. 1, an OLED display apparatus may include a timing controller, a data signal driver, a scanning signal driver, a light emitting signal driver, and a pixel array. The pixel array may include a plurality of scanning signal lines (S1 to Sm), a plurality of data lines (D1 to Dn), a plurality of light emitting signal lines (E1 to Eo), and a plurality of sub-pixels Pxij. In an exemplary embodiment, the timing controller may provide a gray-scale value and a control signal suitable for a specification of the data signal driver to the data signal driver, may provide a clock signal, a scan starting signal, etc., suitable for a specification of the scanning signal driver to the scanning signal driver, and may provide a clock signal, an emission stopping signal, etc., suitable for a specification of the light emitting signal driver to the light emitting signal driver. The data signal driver may generate a data voltage to be provided to data lines D1, D2, D3, . . . , to Dn using the gray-scale value and the control signal received from the timing controller. For example, the data signal driver may sample the gray-scale value using the clock signal and apply the data voltage corresponding to the gray-scale value to the data lines D1 to Dn by taking a sub-pixel row as a unit, where n may be a natural number. The scanning signal driver may receive the clock signal, a scan starting signal, etc., from the timing controller to generate a scanning signal to be provided to the scanning lines S1, S2, S3, . . . , to Sm. For example, the scanning signal driver may sequentially provide the scanning signal with an On-level pulse to the scanning signal lines S1 to Sm. For example, the scanning signal driver may be constructed in a form of a shift register and sequentially transmit the scan starting signal provided in form of an On-level pulse to a next-stage circuit under the control of the clock signal to generate the scanning signal, where m may be a natural number. The light emitting signal driver may receive the clock signal, and the emission stopping signal, etc., from the timing controller to generate an emission signal to be provided to the light emitting signal lines E1, E2, E3, . . . , to Eo. For example, the light emitting signal driver may sequentially provide the emission signal with an Off-level pulse to the light emitting signal lines E1 to Eo. For example, the light emitting signal driver may be constructed into a form of a shift register and can sequentially transmit a light emitting stopping signal provided in form of an Off-level pulse to a next-stage circuit under the control of the clock signal to generate the light emitting signal, where o may be a natural number. The pixel array may include a plurality of sub-pixels Pxij. Each sub-pixel Pxij may be connected to a corresponding data line, a corresponding scanning signal line, and a corresponding light emitting signal line, where i and j may be natural numbers. The sub-pixel Pxij may refer to a sub-pixel in which a transistor is connected to an ith scanning signal line as well as a jth data line.

Figure 2:
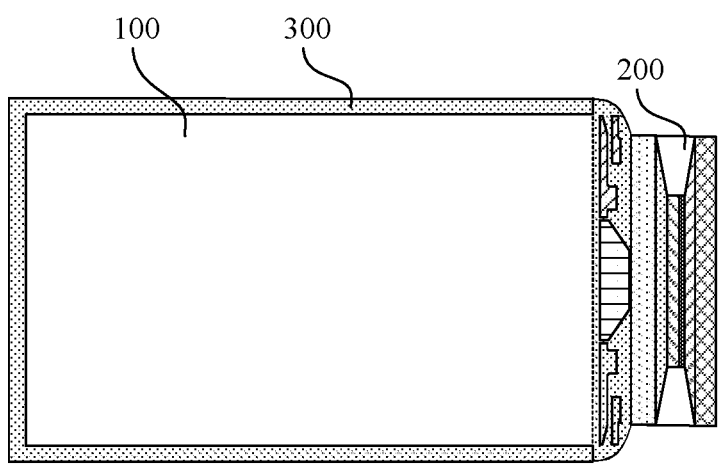
FIG. 2 illustrates a schematic diagram of a plan structure of a display substrate.

FIG. 2 illustrates a schematic diagram of a plan structure of a display substrate. As shown in FIG. 2, the display substrate may include a display region 100, a bonding region 200 on a side of the display region 100, and a border region 300 on other sides of the display region 100. The display region 100 may include a plurality of sub-pixels configured to display moving pictures or still images, the bonding region 200 may include connection lines and circuits for connecting multiple data lines to an integrated circuit, and the border region 300 may include a power supply line for transmitting a voltage signal, and the bonding region 200 and the border region 300 may include an isolating dam of a circular structure. At least one side of the border region 300 may be a crimping region formed by bending, or both the display region 100 and the border region 300 are bending or crimping regions, and this is not limited in the present disclosure.

Figure 3:
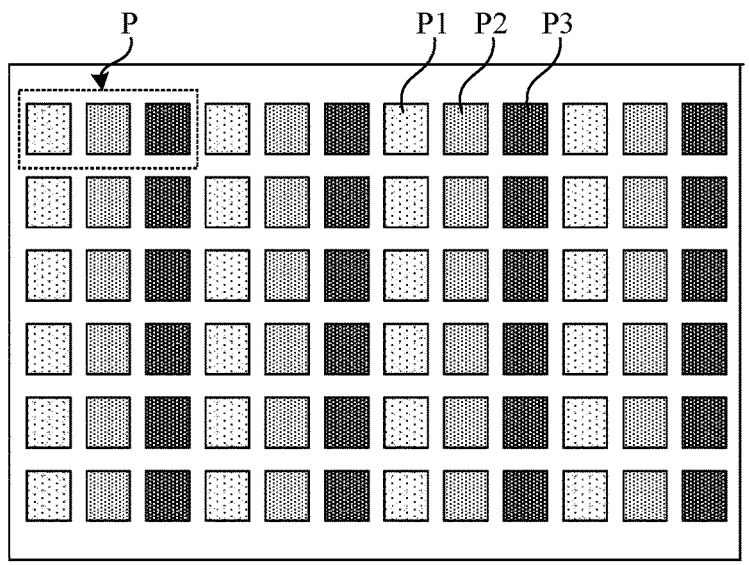
FIG. 3 is a schematic diagram of a plan structure of a display region of a display substrate.

In an exemplary embodiment, the display region may include a plurality of pixel units arranged in a matrix. FIG. 3 is a schematic diagram of a plan structure of a display region in a display substrate. As shown in FIG. 3, the display substrate may include a plurality of pixel units P arranged in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel driving circuit and a light emitting device. The pixel driving circuit in each of the first sub-pixel P1, the second sub-pixel P2, and the third sub-pixel P3 is connected to a scanning signal line, a data line, and a light emitting signal line. The pixel driving circuit is configured to, under the control of the scanning signal line and the light emitting signal line, receive a data voltage transmitted by the data line and output a corresponding current to the light emitting device. The light emitting devices in the first sub-pixel P1, the second sub-pixel P2 and the third sub-pixel P3 are respectively connected to the pixel drive circuits of the sub-pixels where the light emitting devices are located. The light emitting device is configured to emit light with a corresponding brightness in response to a current output by the pixel drive circuit of the sub-pixel where the light emitting device is located.

In an exemplary embodiment, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary embodiment, a shape of the sub-pixel in the pixel unit may be a rectangle, a rhombus, a pentagon, or a hexagon. When a pixel unit includes three sub-pixels, the three sub-pixels may be arranged in a manner to stand side by side horizontally, in a manner to stand side by side vertically, or in a manner like a Chinese character '品'. When a pixel unit includes four sub-pixels, the four sub-pixels may be arranged in a manner to stand side by side horizontally, in a manner to stand side by side vertically, or in a manner to form a square, which is not limited in the present disclosure.

Figure 4:
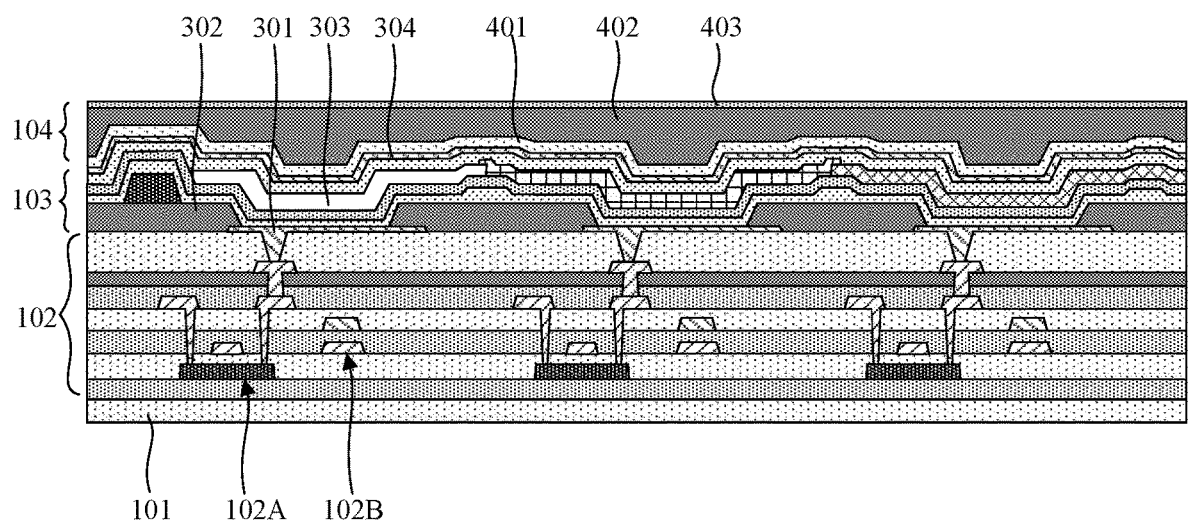
FIG. 4 is a schematic diagram of a cross-sectional view of a structure of a display region of a display substrate.

FIG. 4 is a schematic diagram of a cross-sectional view of a display region in a display substrate, illustrating the structure of three sub-pixels of an OLED display substrate. Referring to FIG. 4, on a plane perpendicular to the display substrate, the display substrate may include a drive circuit layer 102 disposed on a base substrate 101, a light emitting structure layer 103 disposed on a side of the drive circuit layer 102 away from the base substrate 101, and an encapsulation layer 104 disposed on a side of the light emitting structure layer 103 away from the base substrate 101. In some possible embodiments, the display substrate may include other film layers, such as post spacers, which is not limited in the present disclosure.

In an exemplary embodiment, the base 101 may be a flexible base or may be a rigid base. The driving circuit layer 102 of each sub-pixel may include a plurality of transistors and storage capacitors that form a pixel driving circuit. In FIG. 4, only one transistor 102A and one storage capacitor 102B are taken as an example. The light emitting structure layer 103 may include an anode 301, a pixel define layer 302, an organic light emitting layer 303, and a cathode 304. The anode 301 is connected to a drain electrode of a drive transistor 210 through a via. The organic light emitting layer 303 is connected to the anode 301. The cathode 304 is connected to the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

In an exemplary embodiment, the organic light emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, the hole injection layers of all the sub-pixels may be connected together to form a through layer; the electron injection layers of all the sub-pixels may be connected together to form a through layer; the hole transport layers of all the sub-pixels may be connected together to form a through layer; the electron transport layers of all the sub-pixels may be connected together to form a through layer; the hole block layers of all the sub-pixels may be connected together to form a through layer; the light emitting layers of adjacent sub-pixels may have a little overlap, or may be isolated from each other; the electron block layers of the adjacent sub-pixels may have a little overlap, or may be isolated from each other.

Figure 5:
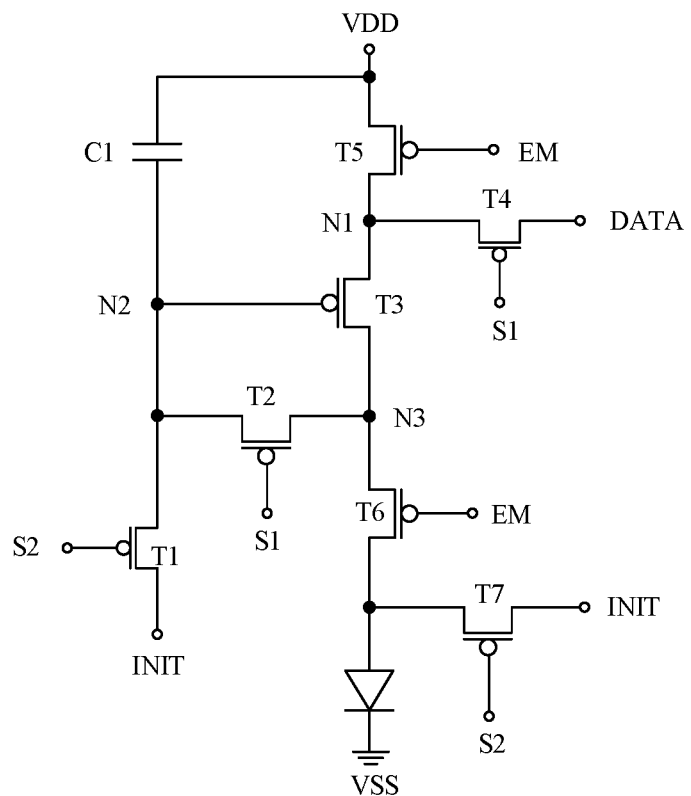
FIG. 5 is a schematic diagram of an equivalent circuit of a pixel drive circuit.

In an exemplary embodiment, the pixel driving circuit may have a structure of 3T1C, 4T1C, 5T1C, 5T2C, 6T1C or 7T1C. FIG. 5 illustrates a schematic diagram of an equivalent circuit of a pixel drive circuit. As shown in FIG. 5, the pixel drive circuit may include seven switch transistors (a first transistor T1 to a seventh transistor T7), one storage capacitor C1 and seven signal lines (a data line DATA, a first scan signal line S1, a second scan signal line S2, an initial signal line INIT, a first power supply line VDD, a second power supply line VSS and a light emitting signal line EM).

In an exemplary embodiment, a gate electrode of the first transistor T1 is connected to the second scan signal line S2, a first electrode of the first transistor T1 is connected to the initial signal line INIT, and a second electrode of the first transistor is connected to a second node N2. A gate electrode of the second transistor T2 is connected to the first scan signal line S1, a first electrode of the second transistor T2 is connected to the second node N2, and a second electrode of the second transistor T2 is connected to a third node N3. A gate electrode of the third transistor T3 is connected to the second node N2, a first electrode of the third transistor T3 is connected to a first node N1, and a second electrode of the third transistor T3 is connected to the third node N3. A gate electrode of the fourth transistor T4 is connected to the first scan signal line S1, a first electrode of the fourth transistor T4 is connected to the data line DATA, and a second electrode of the fourth transistor T4 is connected to the first node N1. A gate electrode of the fifth transistor T5 is connected to the light emitting signal line EM, a first electrode of the fifth transistor T5 is connected to the first power supply line VDD, and a second electrode of the fifth transistor T5 is connected to the first node N1. A gate electrode of the sixth transistor T6 is connected to the light emitting signal line EM, a first electrode of the sixth transistor T6 is connected to the third node N3, and a second electrode of the sixth transistor T6 is connected to a first electrode of the light emitting device. A gate electrode of the seventh transistor T7 is connected to the second scan signal line S2, a first electrode of the seventh transistor T7 is connected to the initial signal line INIT, and a second electrode of the seventh transistor T7 is connected to the first electrode of the light emitting device. A first terminal of the storage capacitor C1 is connected to the second power supply line VDD, and a second terminal of the storage capacitor C1 is connected to the second node N2.

In an exemplary embodiment, the first transistor T1 to the seventh transistor T7 may be P-type transistors or N-type transistors. Using the same type of transistors in the pixel drive circuit can simplify the process flow, reduce the process difficulty of the display panel, and improve the yield of the product. In some possible implementations, the first transistor T1 to the seventh transistor T7 may include P-type transistors and N-type transistors.

In an exemplary embodiment, a second electrode of the light emitting device is connected to the second power supply line VSS, a signal of the second power supply line VSS is a low level signal and a signal of the first power supply line VDD continuously provides a high-level signal. The first scan signal line S1 is a scan signal line in a pixel drive circuit in the present display row, and the second scan signal line S2 is a scan signal line in a pixel drive circuit in a previous display row, that is, for an nth display row, the first scan signal line S1 is S(n), the second scan signal line S2 is S(n−1), the second scan signal line S2 in the present display row and the first scan signal line S1 in the pixel drive circuit in the previous display row may be a same signal line, so as to reduce signal lines of the display panel and realize a narrow border of the display panel.

In an exemplary embodiment, the first scan signal line S1, the second scan signal line S2, the light emitting signal line EM, the initial signal line INIT extend along a horizontal direction, and the second power supply line VSS, the first power supply line VDD and the data line DATA extend along a vertical direction.

In an exemplary embodiment, the light emitting device may be an Organic Light Emitting Diode (OLED), including a first electrode (anode), an organic light emitting layer, and a second electrode (cathode) which are stacked.

Figure 6:
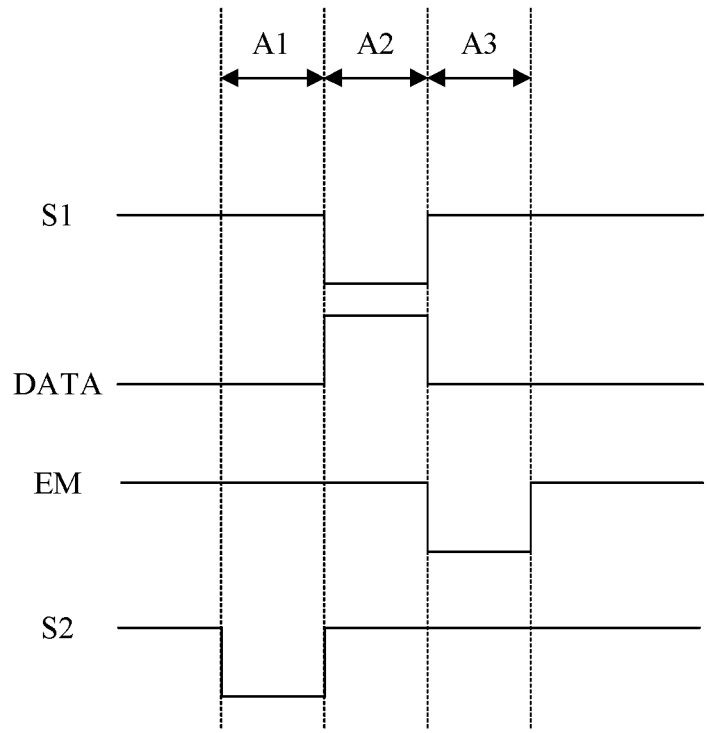
FIG. 6 is a working timing diagram of a pixel drive circuit.

FIG. 6 illustrates a working timing diagram of a pixel drive circuit. An exemplary embodiment of the present disclosure will be described below through a working process of the pixel driving circuit shown in FIG. 5. The pixel driving circuit in FIG. 5 includes seven transistors (the first transistor T1 to the seventh transistor T7), a storage capacitor C1 and seven signal lines (the data line DATA, the first scanning signal line S1, the second scanning signal line S2, the initial signal line INIT, the first power supply line VDD, the second power supply line VSS and the light emitting signal line EM), and the seven transistors are all P-type transistors.

In an exemplary embodiment, the working process of the pixel drive circuit may include the following stages.

In a first stage A1, referred to as a reset stage, a signal of the second scan signal line S2 is a low level signal, and a signal of the first scan signal line S1 and a signal of the light emitting signal line EM are high level signals. The signal of the second scanning signal line S2 is a low-level signal such that the first transistor T1 is turned on, a signal of the initial signal line INIT is provided to the second node N2 to initialize the storage capacitor C1, thereby clearing original data voltage in the storage capacitor. The signals of the first scan signal line S1 and the light emitting signal line EM are high level signals, to turn the second transistor T2, the fourth transistor T4, the fifth transistor T5, the sixth transistor T6 and the seventh transistor T7 off. The OLED does not emit light during this stage.

In a second stage A2, referred to as a data writing stage or a threshold compensation stage, the signal of the first scan signal line S1 is a low level signal, the signals of the second scan signal line S2 and the light emitting signal line EM are high level signals, and the data line DATA outputs a data voltage. In this stage, the second terminal of the storage capacitor C1 is of a low level, so that the third transistor T3 is turned on. The signal of the first scan signal line S1 is a low-level signal, so that the second transistor T2, the fourth transistor T4 and the seventh transistor T7 are turned on. The second transistor T2 and the fourth transistor T4 are turned on so that the data voltage output by the data line DATA is provided to the second node N2 through the first node N1, the turned-on third transistor T3, the third node N3, and the turned-on second transistor T2, and a voltage difference between the data voltage output by the data line DATA and a threshold voltage of the third transistor T3 is charged to the storage capacitor C1, where a voltage at the second terminal of the storage capacitor C1 (the second node N2) is Vdata−|Vth|, the data voltage output by the data line DATA is Vdata, and the threshold voltage of the third transistor T3 is Vth. The seventh transistor T7 is turned on, so that the initial voltage of the initial signal line INIT is provided to the first electrode of the OLED to initialize (reset) the first electrode of the OLED, clear its internal pre-stored voltage, and complete the initialization, thus ensuring that the OLED does not emit light. The signal of the second scanning signal line S2 is a high-level signal, so that the first transistor T1 is turned off. The signal of the light emitting signal line EM is a high level signal, to turn the fifth transistor T5 and the sixth transistor T6 off.

In a third stage A3, referred to as a light emitting stage, the signal of the light emitting signal line EM is a low level signal, and the signals of the first scan signal line S1 and the second scan signal line S2 are high level signals. The signal of the light emitting signal line EM is a low level signal, to turn the fifth transistor T5 and the sixth transistor T6 on. A supply voltage output by the first power supply line VDD provides a drive voltage to the first electrode of the OLED through the turned-on fifth transistor T5, third transistor T3 and sixth transistor T6, to drive the OLED to emit light.

In a driving process of the pixel driving circuit, the driving current flowing through the third transistor T3 (drive transistor) is determined by a voltage difference between the gate electrode and first electrode thereof. Since the voltage of the second node N2 is Vdata−|Vth|, the driving current of the third transistor T3 is:

$$I=K*(Vgs-Vth)^2=K*[(Vdd-Vdata+|Vth|)-Vth]^2=K*[(Vdd-Vdata]^2$$

Herein, I is a driving current flowing through the third transistor T3, that is, a driving current that drives the OLED to emit light, K is a constant, Vgs is a voltage difference between the gate electrode and the first electrode of the third transistor T3, Vth is a threshold voltage of the third transistor T3, Vdata is a data voltage output by the data line DATA, and Vdd is a supply voltage output by the first power supply line VDD.

Figure 7:
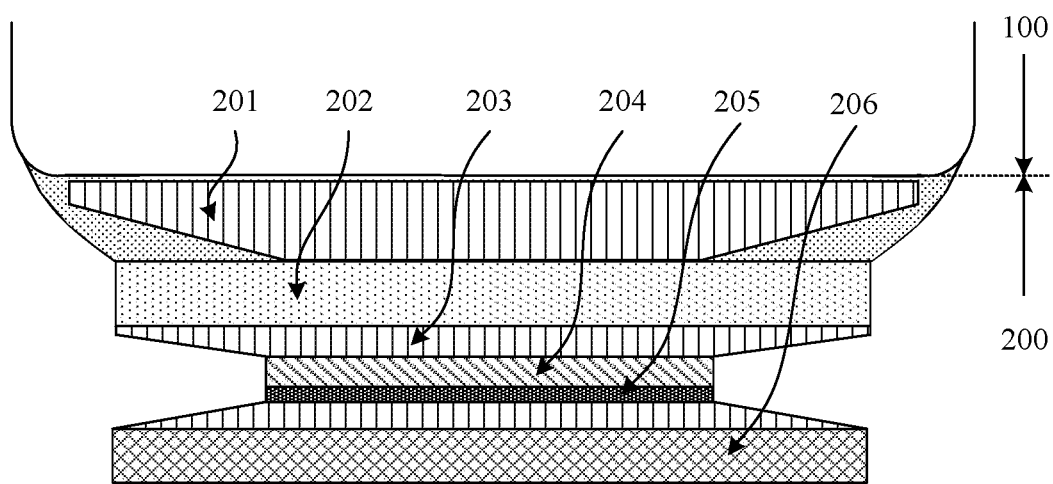
FIG. 7 is a schematic plan view of a bonding region in a display substrate.
Figure 8:
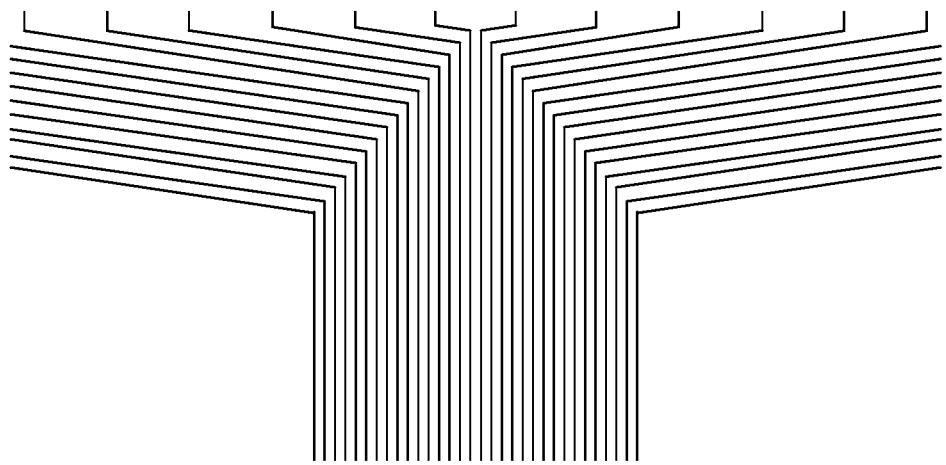
FIG. 8 is a schematic diagram of data fanout lines in a bonding region.

FIG. 7 is a schematic plan view of a bonding region in a display substrate. FIG. 8 is a schematic diagram of data fanout lines in a bonding region. As shown in FIG. 7, in a direction parallel to the display substrate, a bonding region 200 is located on a side of a display region 100. The bonding region 200 may include a first fanout area 201, a bending area 202, a second fanout area 203, an anti-static area 204, a driver chip area 205, and a bonding pin area 206 that are arranged in sequence along a direction away from the display region 100. The first fanout area 201 at least includes data fanout lines. A plurality of data fanout lines are configured to be connected to Data Lines of the display region in a Fanout wiring manner, as shown in FIG. 8. The bending area 202 includes a composite insulating layer provided with a groove, and is configured to bend the bonding region 200 to the back of the display region 100. The second fanout area 203 includes a plurality of data fanout lines that are led out in a fanout wiring manner. The anti-static area 204 includes an anti-static circuit configured to prevent electrostatic damage of the display substrate by eliminating electrostatic. The driver chip area 205 includes an Integrated Circuit (IC for short) and is configured to be connected to the plurality of data fanout lines. The bonding pin area 206 includes Bonding Pads, and is configured to be bonded to an external Flexible Printed Circuit (FPC for short).

With the development of OLED display technologies, consumers have higher requirements for the display effect of display products. Super-narrow borders have become a new trend in the development of display products. Therefore, border narrowing or even a border-less design has received more attention in the design of OLED display products. At present, a left border, a right border, and an upper border of the display apparatus may be controlled within 1.0 mm. However, the narrowing design of the lower border (a border on a side of the bonding region) is more difficult to implement, which is always maintained at about 2.0 mm. This is because the data fanout lines are usually arranged in the fanout area of the bonding region, where the fanout area has large space occupation. Generally, a width of the bonding region is less than a width of the display region, the signal wires of the integrated circuit and the bonding pads in the bonding region are required to be led into a wider display region through the fanout area in a fanout manner, the greater the width difference between the display region and the bonding region, the more the oblique fanout lines in the fanout area, the longer the distance between the driver chip area and the display region, and the wider the lower border, resulting in that the lower border is much larger than the left and right borders.

An exemplary embodiment of the disclosure provides a display substrate. The display substrate may include a display region and a bonding area located at a side of the display region, wherein the bonding area at least includes a lead area; the display region includes a plurality of data lines and a plurality of data fanout lines, and the lead area includes a plurality of lead wires; at least one lead wire is connected with a data line through a data fanout line; in a plane perpendicular to the display substrate, the display substrate includes a first conductive layer, a second conductive layer, a third conductive layer and a fourth conductive layer, and insulating layers are arranged between the first conductive layer and the second conductive layer, between the second conductive layer and the third conductive layer, between the third conductive layer and the fourth conductive layer; the data lines and data fanout lines are arranged in different conductive layers.

Figure 9:
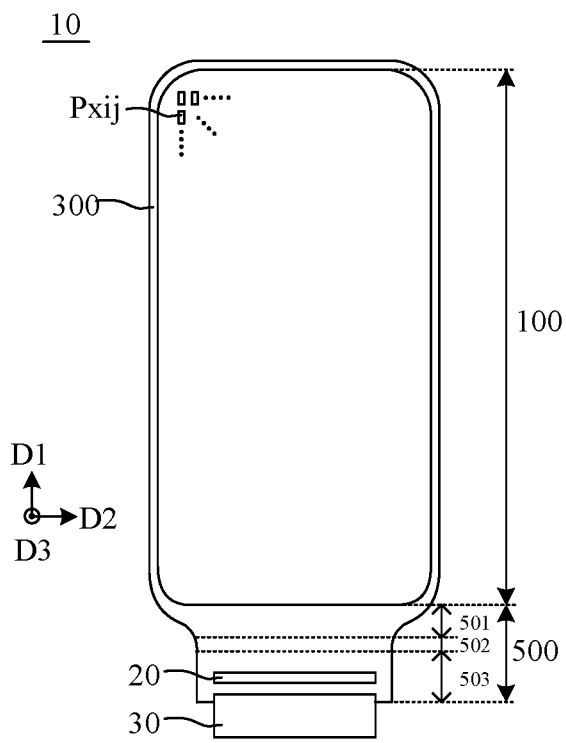
FIG. 9 is a schematic diagram of a plan structure of a display substrate according to an exemplary embodiment of the present disclosure.
Figure 10:
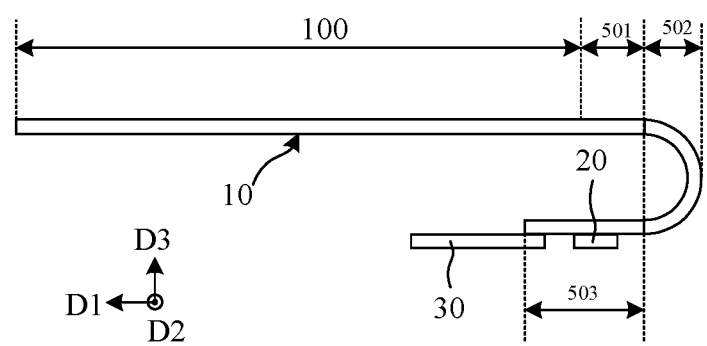
FIG. 10 is a side view of the display substrate in FIG. 9.

FIG. 9 is a schematic diagram of a plan structure of a display substrate according to an exemplary embodiment of the present disclosure. FIG. 10 is a side view of the display substrate in FIG. 9. As shown in FIG. 9 and FIG. 10, the display substrate 10 may include a display region 100, a bonding region 500 on a side of the display region 100, and a border region 300 on other sides of the display region 100. In an exemplary embodiment, the display region 100 may be a planarization region, including a plurality of sub-pixels Pxij forming a pixel array, a plurality of data lines, and a plurality of data fanout lines. The plurality of sub-pixels are configured to display a dynamic picture or a static image; the plurality of data lines are configured to provide data signals to the plurality of sub-pixels Pxij; the plurality of data fanout lines are correspondingly connected to the plurality of data lines, and are configured to connect the plurality of data lines with a plurality of lead wires in the bonding region 500 correspondingly. In an exemplary embodiment, the display substrate may be a flexible substrate, and accordingly the display substrate can be deformed, for example, can be crimped, bent, folded, or curled.

In an exemplary embodiment, the bonding region 500 may include a lead area 501, a bending area 502, and a composite circuit area 503 that are arranged in sequence along an opposite direction (a direction away from the display region) of the first direction D1. The lead area 501 is connected to the display region 100, the bending area 502 is connected to the lead area 501, and the composite circuit area 503 is connected to the bending area 502.

In an exemplary embodiment, the lead area 501 may be provided with a plurality of lead wires. Ends of a part of the plurality of lead wires are correspondingly connected to the plurality of data fanout lines in the display region 100, and ends of the other part of the plurality of lead wires are correspondingly connected to the plurality of data lines in the display region 100, and the other ends of the plurality of lead wires go cross the bending area 502 to be connected to an integrated circuit of the composite circuit area 503, so that the integrated circuit applies data signals to the data lines through the lead wires and the data fanout lines.

In an exemplary embodiment, the bending area 502 may be bent with a curvature in a third direction D3, so that a surface of the composite circuit area 503 may be turned over, that is, a surface, facing upwards, of the composite circuit area 503 may be changed to face downwards through the bending of the bending area 502, where the third direction D3 intersects with the first direction D1. In an exemplary embodiment, when the bending area 502 is bent, the composite circuit area 503 may be overlapped with the display region 100 in the third direction D3 (a thickness direction).

In an exemplary embodiment, the composite circuit area 503 may include an anti-static area, a driver chip area, and a bonding pin area. An Integrated Circuit (IC for short) 20 may be bonded to the driver chip area, and a Flexible Printed Circuit (FPC for short) 30 may be bonded to the bonding pin area. In an exemplary embodiment, the integrated circuit 20 may generate a drive signal required for driving sub-pixels, and may provide a drive signal to the sub-pixels in the display region 100. For example, the drive signal may be a data signal that drives the luminance of the sub-pixels. In an exemplary embodiment, the integrated circuit 20 may be bonded to the driver chip area by an anisotropic conductive film or other ways. A width of the integrated circuit 20 in a second direction D2 may be less than a width of the composite circuit area 503 in the second direction D2, where the second direction D2 intersects with the first direction D1. In an exemplary embodiment, the bonding pin area may be provided with bonding pads containing a plurality of PINs, and the flexible circuit board 30 may be bonded to the bonding pads.

In an exemplary embodiment, the first direction D1 may be an extension direction (a column direction) of the data lines in the display region, the second direction D2 may be an extension direction (a row direction) of the scanning signal lines in the display region, the third direction D3 may be a direction perpendicular to the plane of the display substrate, the first direction D1 and the second direction D2 may be perpendicular to each other, and the first direction D1 and the third direction D3 may be perpendicular to each other.

Figure 11:
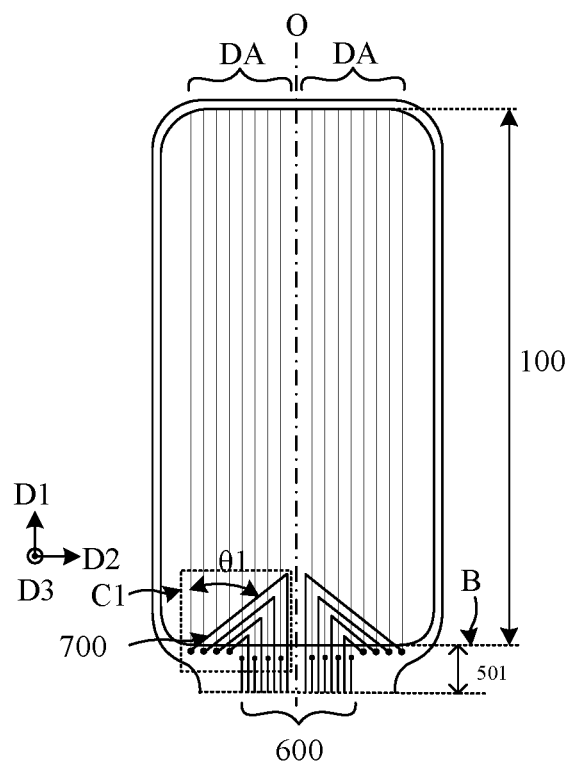
FIG. 11 is a schematic diagram of a structure of lead wires and data fanout lines according to an exemplary embodiment of the present disclosure.

FIG. 11 is a schematic diagram of a structure of lead wires and data fanout lines according to an exemplary embodiment of the present disclosure. As shown in FIG. 11, a display region 100 may include a plurality of sub-pixels that are arranged in a matrix, a plurality of data lines DA, and a plurality of data fanout lines 700. A lead area 501 of the bonding region may include a plurality of lead wires 600. In an exemplary embodiment, the plurality of sub-pixels in the display region 100 form a plurality of pixel rows and a plurality of pixel columns; the plurality of data lines DA extend along an opposite direction of a first direction D1, and are sequentially arranged at a set interval along a second direction D2; each data line DA is connected to all sub-pixels of one pixel column in the display region 100; and an end of each data line DA extends to a lead area 501 of the bonding region. A first end of each data fanout line 700 is correspondingly connected to a part of the lead wires 600 in the lead area 501. A second end of each data fanout line 700 is correspondingly connected to a part of the data lines DA that extend to the lead area 501. A part of the lead wires 600 in the lead area 501 are connected to the data fanout lines 700, and the other part of the lead wires 600 are correspondingly connected to the other part of the data lines DA that extend to the lead area 501.

In an exemplary embodiment, the display substrate has a center line O, and the center line O extends along the first direction D1 and equally divides the plurality of pixel columns of the display region 100. A plurality of data lines DA and a plurality of data fanout lines 700 in the display region 100, and a plurality of lead-out lines 600 in the lead area 501 of the bonding area may be symmetrically arranged relative to the center line O. In some other exemplary embodiments, a plurality of data lines DA and a plurality of data fanout lines 700 in the display region 100, and a plurality of lead-out lines 600 in the lead area 501 of the bonding area may be asymmetrically arranged on both sides of the center line O. For example, a plurality of data lines DA and a plurality of data fanout lines 700 in the display region 100, and a plurality of lead-out lines 600 in the lead area 501 of the bonding area may have similar designs on two sides of the center line O. That the left side of the display substrate contains N data lines, M data fanout lines, and N lead wires is taken as an example for description below, where N is a positive integer greater than 2, and M is a positive integer greater than 2 and less than N.

In an exemplary embodiment, the N data lines on the left side of the display region may include a first data line group and a second line group that are divided by serial numbers. The first data line group may include a first data line DA1, a second data line DA2, . . . , and an Mth data line, and the second data line group may include an (M+1)th data line, an (M+2)th data line, . . . , and an Nth data line.

In an exemplary embodiment, M may be the quantity of data lines required to be led out in a fanout manner. For example, when N is an even number, M may be N/2, and when N is an odd number, M may be (N+1)/2, or M may be (N−1)/2. M may be set according to actual situations, which is not limited in the present disclosure.

In an exemplary embodiment, the plurality of data lines of the first data line group are arranged in sequence along the second direction D2 in order of increasing numbers, the plurality of data lines of the second data line group are arranged in sequence along the second direction D2 in order of increasing numbers, and the second data line group is arranged on one side of the first data line group in the second direction D2. That is, the N data lines include a first data line DA1, a second data line DA2, . . . , and an Nth data line DAN that are arranged in sequence along the second direction D2, that is, the serial numbers of the N data lines gradually increase along the second direction D2. In an exemplary embodiment, an ith data line may be a data line located in an ith pixel column, and the ith data line is connected to sub-pixels in the ith pixel column.

In an exemplary embodiment, the N lead wires on the left side of the lead area 501 may include a first lead group and a second lead group that are divided by serial numbers. The first lead group may include a first lead wire 601, a second lead wire 602, . . . , an Mth lead wire, the second lead group may include an (M+1)th lead wire, an (M+2)th lead wire, . . . , and an Nth lead wire.

In an exemplary embodiment, the plurality of lead wires of the first lead group are arranged in sequence along an opposite direction of the second direction D2 in order of increasing numbers; the plurality of lead wires of the second lead group are arranged in sequence along the second direction D2 in order of increasing numbers; and the lead wires of the first lead group and the lead wires of the second lead group are alternately arranged. For example, the first lead wire is adjacent to the Nth lead wire, the second lead wire is adjacent to the (N−1)th lead wire, . . . , and the Mth lead wire is adjacent to the (M+1)th lead wire.

In an exemplary embodiment, the plurality of lead wires in the first lead group may be correspondingly connected to the plurality of data lines in the first data line group through a plurality of data fanout lines, and the plurality of lead wires in the second lead group may be directly connected to the plurality of data lines in the second data line group correspondingly, so that the lead wires may provide data signals to the data lines directly or through the data fanout lines.

In an exemplary embodiment, a first end of an ith data fanout line is connected to an ith lead wire in the first lead group at a position near an edge B of the display region, and a second end of the ith data fanout line extends in a direction away from the lead area 501 first, and then returns to the lead area 501, to be connected to the ith data line in the first data line group that extends to the lead area 501, where i=1, 2, . . . , and M. In an exemplary embodiment, the edge B of the display region is an edge, on a side, close to the lead area 501, of the display region 100.

In an exemplary embodiment, an ith data fanout line may include a first line segment and second line segment that are connected in sequence. A first end of the first line segment is located near the edge B of the display region and connected to an ith lead wire. A second end of the first line segment extends in a direction away from the lead area, and then is connected to a first end of the second line segment. A second end of the second line segment extends to the lead area 501 from the display region 100 in a direction towards the lead area, and then is connected to an ith data line that extends to the lead area 501.

In an exemplary embodiment, the second line segment may include an extending segment and a connecting segment; a first end of the extending segment is located in the display region 100, and is connected to the second end of the second line segment, and a second end of the extending segment extends to an edge of the display region B in a direction towards the lead area, then is connected to a first end of the connecting segment; and a second end of the connecting segment extends in a direction away from the display region, then is connected to the ith data line, which extends to the lead area, through a via.

In an exemplary embodiment, the connecting segment may be a polygonal line segment, including a vertical line segment parallel to the first direction D1 and a transverse line segment parallel to the second direction D2.

In an exemplary embodiment, the plurality of data lines in the first data line group and the second data line group may be arranged to be parallel to the first direction D1, and the plurality of lead wires in the first lead group and the second group may be arranged to be parallel to the first direction D1, that is, the lead wires are parallel to the data lines.

In an exemplary embodiment, extension lines, in the first direction D1, of the plurality of data lines in the second data line group may be correspondingly overlapped with the plurality of lead wires in the second lead group.

In an exemplary embodiment, each of the first line segments of the plurality of data fanout lines may be arranged to be parallel to the first direction D1, and each of the second line segments of the plurality of data fanout lines may be arranged to form a first included angle θ1 with the first direction D1, and the first included angle θ1 may be about greater than 0° and less than 90°.

In an exemplary embodiment, the first included angle θ1 may be about 20° to 70°, and the first included angle θ1 and the second included angle θ2 may be the same or different.

In an exemplary embodiment, at least one first line segment is arranged between adjacent data lines.

In an exemplary embodiment, a plurality of line segments of a kth data fanout line may form a triangle wiring, the triangle wiring formed by the kth data fanout line is within a triangle wiring formed by a (k−1)th data fanout line, and thus a triangle nested structure is formed; a distance between a first end of a second line segment of the (k−1)th data fanout line and the edge B of the display region is greater than a distance between a first end of a second line segment of the kth data fanout line and the edge B of the display region; and a distance between a second end of a first line segment and a second end of the second line segment of the (k−1)th data fanout line is greater than a distance between a second end of a first segment and a second end of the second line segment of the kth data fanout line, where k=2, . . . , M.

Figure 12:
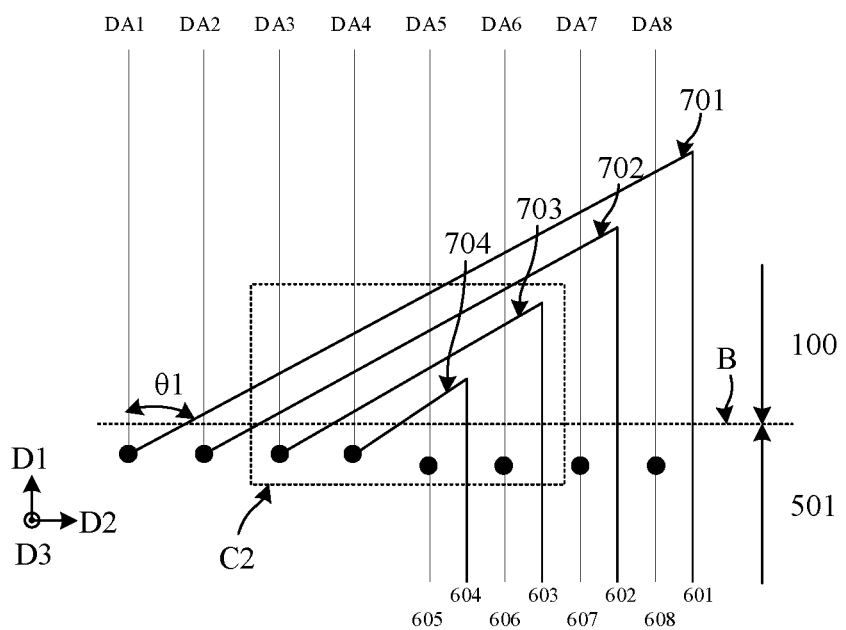
FIG. 12 is an enlarged view of region C1 in FIG. 11.

FIG. 12 is an enlarged view of region C1 in FIG. 11, illustrating the structure of lead wires and data fanout lines when N=8. As shown in FIG. 12, a plurality of data lines may include a first data line DA1, a second data line DA2, a third data line DA3, a fourth data line DA4, a fifth data line DA5, a sixth data line DA6, a seventh data line DA7, and an eighth data line DA8 that are sequentially arranged along the second direction D2; a plurality of lead wires of the lead area 501 of the bonding region may include a first lead wire 601, an eighth lead wire 608, a second lead wire 602, a seventh lead wire 607, a third lead wire 603, a sixth lead wire 606, a fourth lead wire 604, and a fifth lead wire 605 that are sequentially arranged along the opposite direction of the second direction D2.

In an exemplary embodiment, a first end of a first data fanout line 701 is connected to the first lead wire 601 at a position near the edge B of the display region; and a second end of a first data fanout line 701 extends to a position near the first data line DA1 of the display region 100, and then extends to the lead area 501 from the display region 100 to be connected to the first data line DA1. A first end of a second data fanout line 702 is connected to the second lead wire 602 at a position near the edge B of the display region; and a second end of a second data fanout line 702 extends to a position near the second data line DA2 of the display region 100, and then extends to the lead area 501 from the display region 100 to be connected to the second data line DA2. A first end of a third data fanout line 703 is connected to the third lead wire 603 at a position near the edge B of the display region; and a second end of the third data fanout line 703 extends to a position near the third data line DA3 of the display region 100, and then extends to the lead area 501 from the display region 100 to be connected to the third data line DA3. A first end of a fourth data fanout line 704 is connected to the fourth lead wire 604 at a position near the edge B of the display region; and a second end of the fourth data fanout line 704 extends to a position near the fourth data line DA4 of the display region 100, and then extends to the lead area 501 from the display region 100 to be connected to the fourth data line DA4.

In an exemplary embodiment, the fifth data line DA5 extending to the lead area 501 is directly connected to the fifth lead wire 605; the sixth data line DA6 extending to the lead area 501 is directly connected to the sixth lead wire 606; the seventh data line DA7 extending to the lead area 501 is directly connected to the seventh lead wire 607; and the eighth data line DA8 extending to the lead area 501 is directly connected to the eighth lead wire 608.

Though the second line segments of the data fanout lines being located on the right side of the corresponding data lines is taken as an example for description in the exemplary embodiment shown in FIG. 12, in the present disclosure, the second line segments of the data fanout lines may be located on the left side of the corresponding data lines, or a part of the second line segments are located on the right side of the data lines, and the other part of the second line segments are located on the left side of the data lines, which is not limited in the present disclosure.

Figure 13:
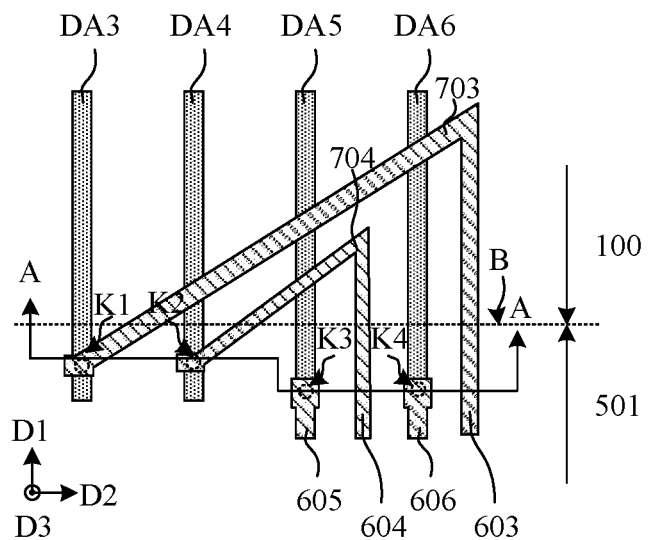
FIG. 13 is an enlarged view of region C2 in FIG. 12.

FIG. 13 is an enlarged view of region C2 in FIG. 12. As shown in FIG. 13, the third data line DA3, the fourth data line DA4, the fifth data line DA5, and the sixth data line DA6 respectively extend to the lead area 501 of the bonding region along the first direction D1. In the lead area 501, the third data fanout line 703 extends to a position near the third data line DA3 of the display region 100 first, and then extends to the lead area 501 from the display region 100, and is connected to an end of the third data line DA3 through a first via K1. The fourth data fanout line 704 extends to a position near the fourth data line DA4 of the display region 100 first, and then extends to the lead area 501 from the display region 100, and is connected to an end of the fourth data line DA4 through a second via K2. The fifth lead wire 605 is connected to an end of the fifth data line DA5 through a third via K3, and the sixth connecting signal line 606 is connected to an end of the sixth data line DA6 through a fourth via K4.

In an exemplary embodiment, the data lines and the data fanout lines may be arranged in different film layers, and an insulating layer may be arranged between the data lines and the data fanout lines.

In an exemplary embodiment, the lead wires and the data fanout lines may be arranged in the same film layer and formed simultaneously in one patterning process, and the lead wires and the data fanout lines may be of an integrated structure connected to each other.

In an exemplary embodiment, the lead wires and the data fanout lines may be arranged in different film layers, an insulating layer may be arranged between the two, and the two are connected through vias.

Figure 14:
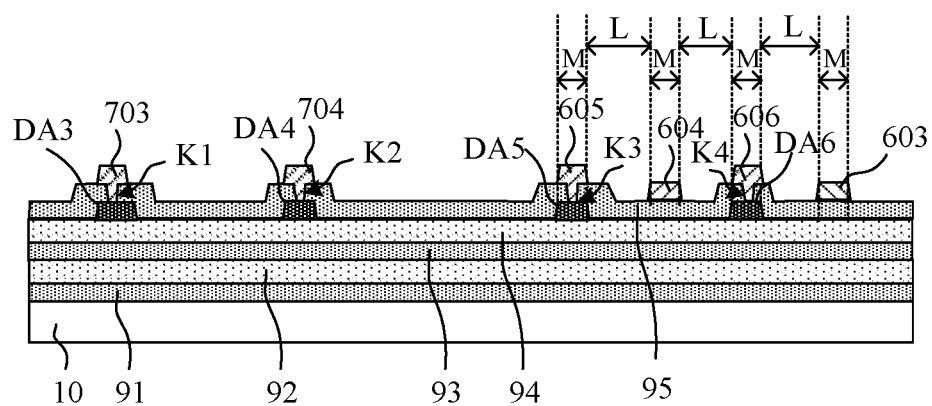
FIG. 14 is a sectional view taken along a direction A-A in FIG. 13.

FIG. 14 is a sectional view along a direction A-A in FIG. 13. As shown in FIG. 14, in a plane perpendicular to a display substrate, the display substrate may include a plurality of conductive layers arranged on a substrate, and the plurality of conductive layers may include a first conductive layer, a second conductive layer, a third conductive layer, and a fourth conductive layer that are sequentially arranged along a direction away from the substrate. The first conductive layer (not shown in the figure) may include a scanning signal line, gate electrodes of a plurality of transistors, a light emission control line and a first plate of the storage capacitor. The second conductive layer (not shown in the figure) may include an initial signal line, a plate connection line and a second plate of the storage capacitor. The third conductive layer may include a first power supply line (not shown in the figure), a data line, sources electrodes and drain electrodes of a plurality of transistors (not shown in the figure). The fourth conductive layer may include a data fanout line.

In an exemplary embodiment, in a plane perpendicular to a display substrate, the display substrate may include a semiconductor layer and a plurality of insulating layers; the semiconductor layer may include active layers of a plurality of transistors; and the plurality of insulating layers may include a first insulating layer 91, a second insulating layer 92, a third insulating layer 93, a fourth insulating layer 94, and a fifth insulating layer 95 that are sequentially arranged along a direction away from the substrate. In an exemplary embodiment, the first insulating layer 91 is arranged on the substrate 10, the semiconductor layer is arranged on a side, away from the substrate, of the first insulating layer 91; the second insulating layer 92 covers the semiconductor layer; the first conductive layer is arranged on a side, away from the substrate, of the second insulating layer 92; the third insulating layer 93 covers the first conductive layer; the second conductive layer is arranged on a side, away from the substrate, of the third insulating layer 93; the fourth insulating layer 94 covers the second conductive layer; the third conductive layer is arranged on a side, away from the substrate, of the fourth insulating layer 94; the fifth insulating layer 95 covers the third conductive layer; and the fourth conductive layer is arranged on a side, away from the substrate, of the fifth insulating layer 95.

In an exemplary embodiment, an orthographic projection of any one of the lead wires on the substrate and orthographic projections of other lead wires on the substrate have no overlap region, and an orthographic projection of any one of the data fanout lines on the substrate and orthographic projections of other data fanout lines on the substrate have no overlap region.

In an exemplary embodiment, the first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be a single layer, multiple layers or a composite layer. The first insulating layer may be called a Buffer layer and configured to prevent ionic impurity diffusion, prevent moisture permeation, and execute a surface planarization function. The second insulating layer arranged between the semiconductor layer and the first conductive layer and the third insulating layer arranged between the first conductive layer and the second conductive layer may be called Gate Insulator (GI) layers. The fourth insulating layer arranged between the second conductive layer and the third conductive layer may be called an Interlayer Dielectric (ILD) layer. The first conductive layer, the second conductive layer, third conductive layer, and the fourth conductive layer may be made of a metal material, for example, any one or more of Argentum (Ag), Copper (Cu), Aluminum (Al), Titanium (Ti), and Molybdenum (Mo), or an alloy material of the abovementioned metals, for example, an Aluminum-Neodymium alloy (AlNd) or a Molybdenum-Niobium alloy (MoNb), and may be a single-layer structure, or a multilayer composite structure such as Ti/Al/Ti. The semiconductor layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the present disclosure is applicable to transistors that are manufactured based on oxide technology, silicon technology or organic technology. The active layer based on the oxide technology may be made of: an oxide that includes indium and tin; an oxide that includes tungsten and indium; an oxide that includes tungsten, indium and zinc; an oxide that includes titanium and indium; an oxide that includes titanium, indium and tin; an oxide that includes indium and zinc; an oxide that includes silicon, indium and tin; or an oxide that includes indium, gallium and zinc, etc.

In an exemplary embodiment, the fifth insulating layer 95 may be provided with a plurality of openings (K1 to K4 in the figure), wherein the plurality of openings are located at ends of the data lines, and portions of the fifth insulating layer 95 in the openings are etched, so that surfaces of the data lines are exposed. The openings are configured such that the data fanout lines or lead wires formed subsequently are correspondingly connected with the data lines through the openings.

In an exemplary embodiment, as shown in FIG. 13 and FIG. 14, a width M of each lead wire is the same, a spacing L between adjacent lead wires is the same, and the width M and the spacing L are both dimensions in the second direction D2. In an exemplary embodiment, the width of each data fanout line may be the same.

Figure 15:
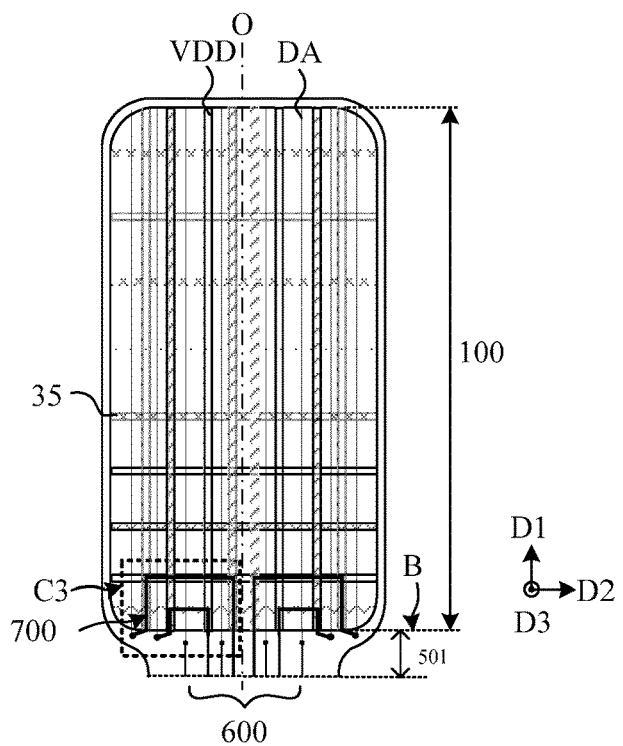
FIG. 15 is another schematic diagram of a structure of lead wires and data fanout lines according to an exemplary embodiment of the present disclosure.
Figure 16:
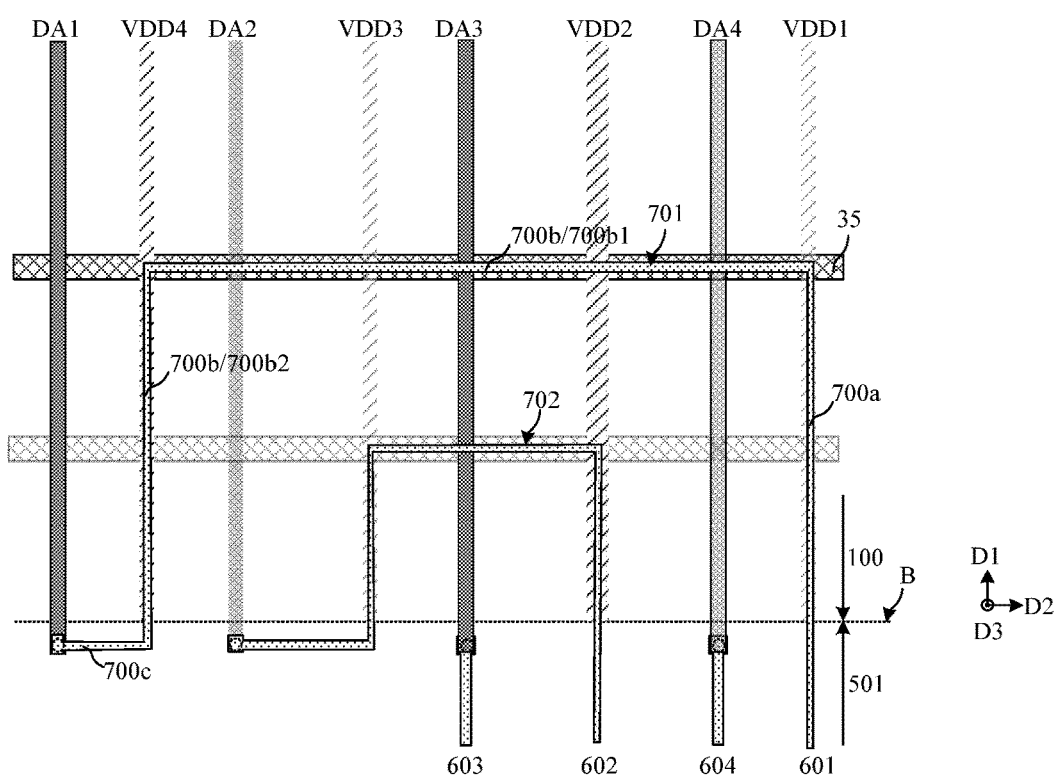
FIG. 16 is an enlarged view of region C3 in FIG. 15.

In an exemplary embodiment, FIG. 15 is another schematic diagram of a structure of lead wires and data fanout lines according to an embodiment of the present disclosure. FIG. 16 is an enlarged view of region C3 in FIG. 15. As shown in FIG. 15 and FIG. 16, the display region further includes first power supply lines VDD and plate connection lines 35, wherein the first power supply lines VDD extend along the first direction D1 and the plate connection lines 35 extend along the second direction D2.

An extending segment 700b includes M1 first sub-line segments 700b1 and M1 second sub-line segments 700b2, wherein M1 is a natural number greater than or equal to 1; the first sub-line segments 700b1 and the second sub-line segments 700b2 are alternately connected, a first sub-line segment 700b1 located at one side of the extending segment 700b is connected with a first line segment 700a, and a second sub-line segment 700b2 located at the other side of the extending segment 700b is connected with a connecting segment 700c. The orthographic projections of the first line segment 700a and the second sub-line segment 700b2 on the display substrate plane both overlap with that of a first power supply line VDD on the display substrate plane, and the orthographic projection of the first sub-line segment 700b1 on the display substrate plane overlaps with that of a plate connection line 35 on the display substrate plane.

Figure 17:
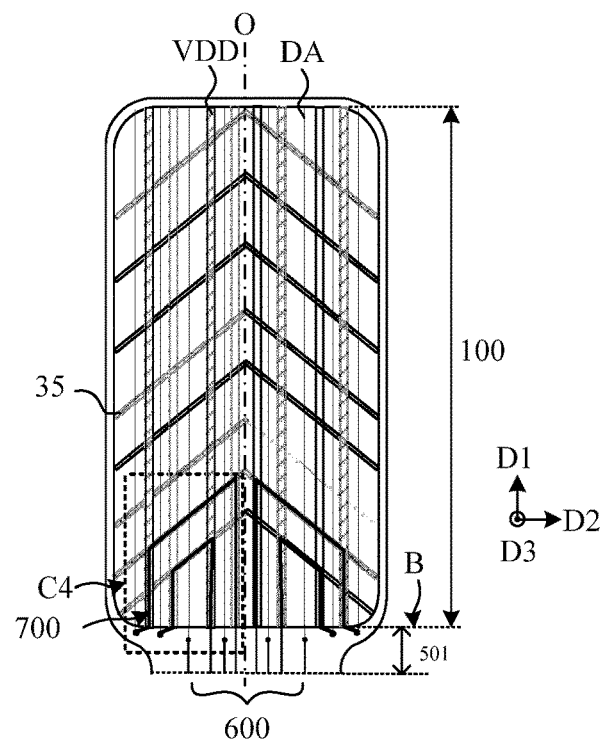
FIG. 17 is still another schematic diagram of a structure of lead wires and data fanout lines according to an exemplary embodiment of the present disclosure.
Figure 18:
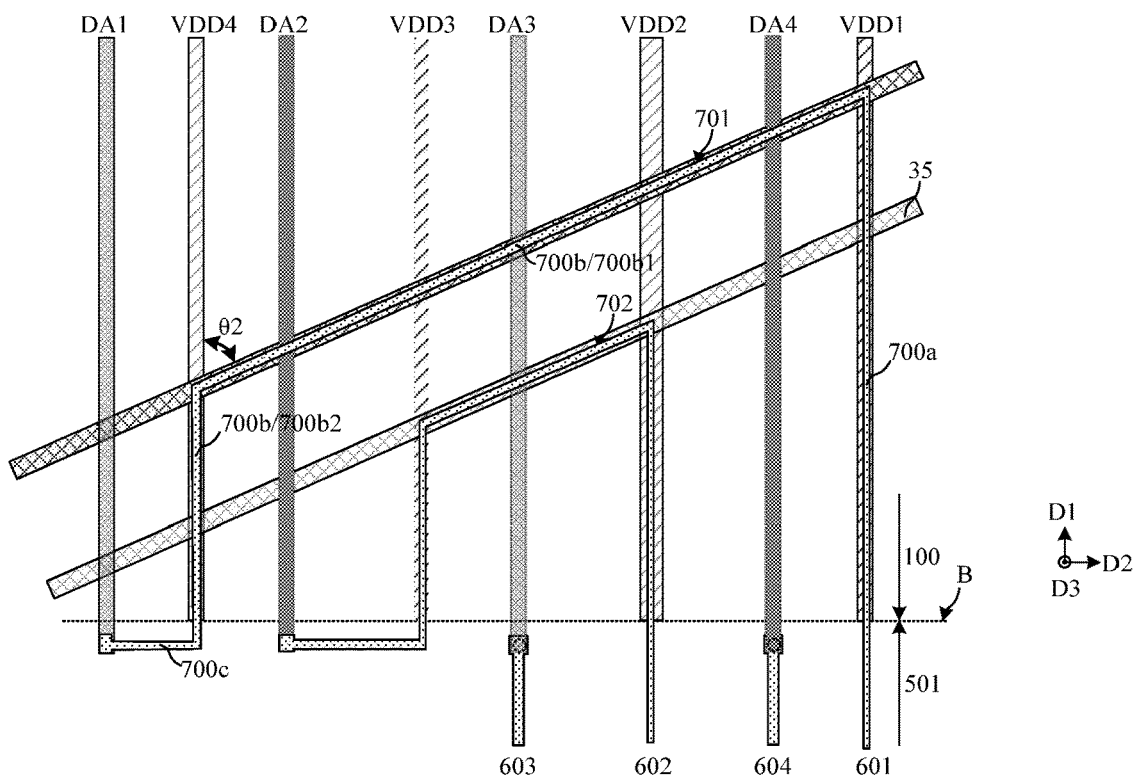
FIG. 18 is an enlarged view of region C4 in FIG. 17.

In an exemplary embodiment, FIG. 17 is still another schematic diagram of a structure of lead wires and data fanout lines according to an embodiment of the present disclosure. FIG. 18 is an enlarged view of region C4 in FIG. 17. As shown in FIG. 17 and FIG. 18, the display region further includes first power supply lines VDD and plate connection lines 35, wherein the first power supply lines VDD extend along the first direction D1 and a second included angle θ2 is formed between the plate connection lines 35 and the first direction D1, and the second included angle is 20° to 70°.

An extending segment 700b includes M1 first sub-line segments 700b1 and M1 second sub-line segments 700b2, wherein M1 is a natural number greater than or equal to 1; the first sub-line segments 700b1 and the second sub-line segments 700b2 are alternately connected, a first sub-line segment 700b1 located at one side of the extending segment 700b is connected with a first line segment 700a, and a second sub-line segment 700b2 located at the other side of the extending segment 700b is connected with a connecting segment 700c. The orthographic projections of the first line segment 700a and the second sub-line segment 700b2 on the display substrate plane both overlap with that of a first power supply line VDD on the display substrate plane, and the orthographic projection of the first sub-line segment 700b1 on the display substrate plane overlaps with that of a plate connection line 35 on the display substrate plane.

In an exemplary embodiment, the plate connection lines 35 are located in the second conductive layer, the first power supply lines VDD are located in the third conductive layer, and the data fanout lines 700 are located in the fourth conductive layer.

Figure 19:
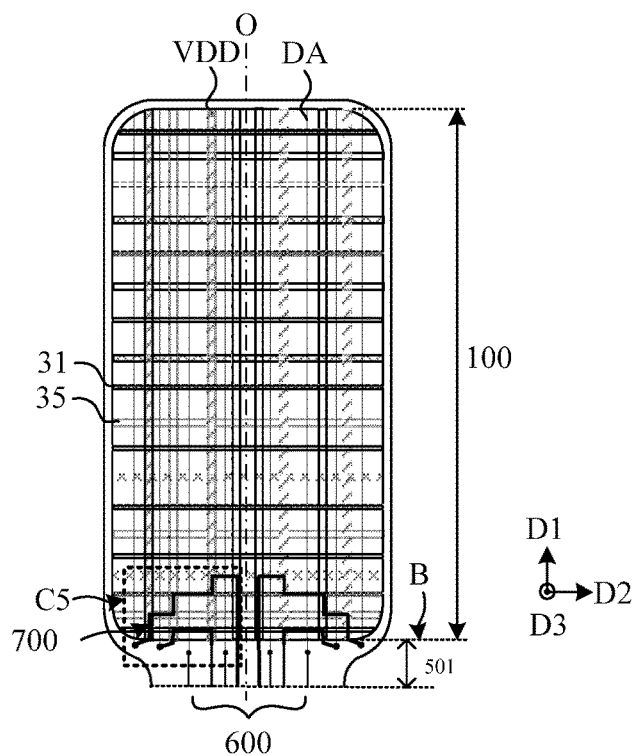
FIG. 19 is still another schematic diagram of a structure of lead wires and data fanout lines according to an exemplary embodiment of the present disclosure.
Figure 20:
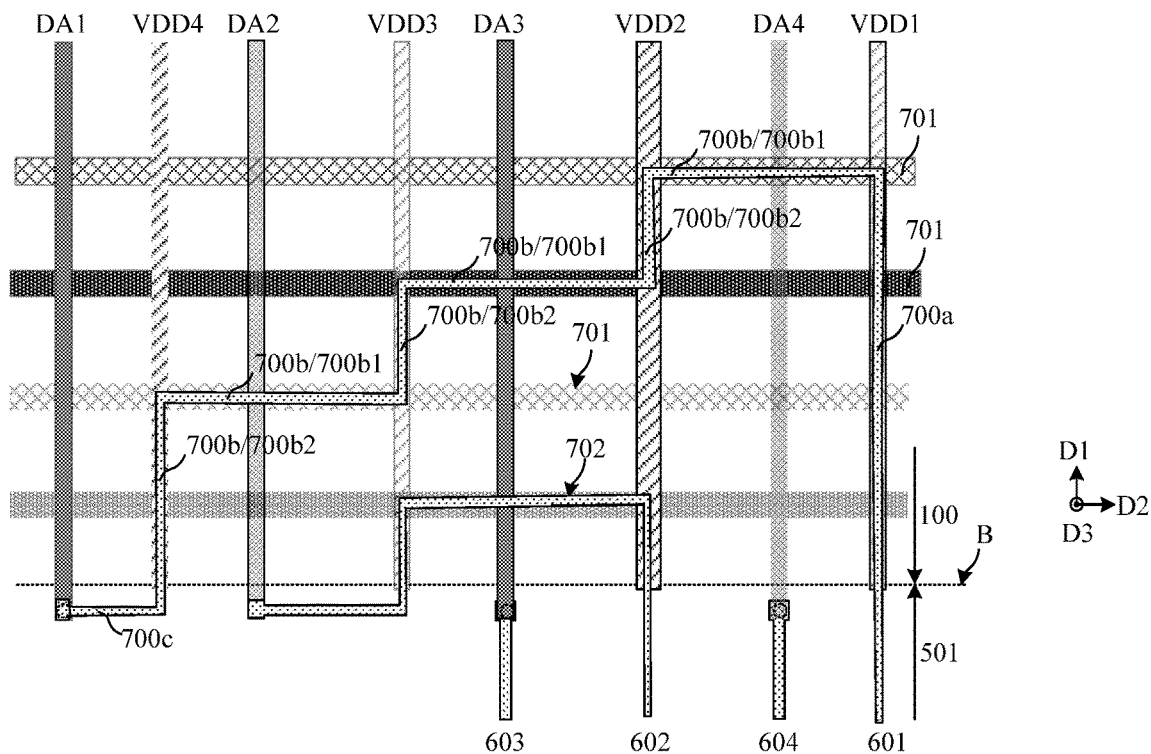
FIG. 20 is an enlarged view of region C5 in FIG. 19.

In an exemplary embodiment, FIG. 19 is still another schematic diagram of a structure of lead wires and data fanout lines according to an embodiment of the present disclosure. FIG. 20 is an enlarged view of region C5 in FIG. 19. As shown in FIG. 19 and FIG. 20, the display region further includes first power supply lines VDD, initial signal lines 31 and plate connection lines 35, wherein the first power supply lines VDD extend along the first direction D1, and the plate connection lines 35 and the initial signal lines 31 both extend along the second direction D2.

An extending segment 700b includes M1 first sub-line segments 700b1 and M1 second sub-line segments 700b2, wherein M1 is a natural number greater than or equal to 1; the first sub-line segments 700b1 and the second sub-line segments 700b2 are alternately connected, a first sub-line segment 700b1 located at one side of the extending segment 700b is connected with a first line segment 700a, and a second sub-line segment 700b2 located at the other side of the extending segment 700b is connected with a connecting segment 700c. The orthographic projections of the first line segment 700a and the second sub-line segment 700b2 on the display substrate plane both overlap with that of a first power supply line VDD on the display substrate plane, and the orthographic projection of the first sub-line segment 700b1 on the display substrate plane overlaps with the orthographic projection, on the display substrate plane, of any one of the following: an initial signal line 31 and a plate connection line 35.

In an exemplary embodiment, the display region further includes first power supply lines VDD, initial signal lines and plate connection lines 35, wherein the first power supply lines VDD extend along a first direction D1, and a second included angle is formed between the initial signal lines 31 and the first direction D1 and is formed between the plate connection lines 35 and the first direction D1, and the second included angle is 20° to 70°.

An extending segment 700b includes M1 first sub-line segments 700b1 and M1 second sub-line segments 700b2, wherein M1 is a natural number greater than or equal to 1; the first sub-line segments 700b1 and the second sub-line segments 700b2 are alternately connected, a first sub-line segment 700b1 located at one side of the extending segment 700b is connected with a first line segment 700a, and the second sub-line segment 700b2 located at the other side of the extending segment 700b is connected with a connecting segment 700c. The orthographic projections of the first line segment 700a and the second sub-line segment 700b2 on the display substrate plane both overlap with that of the first power supply line VDD on the display substrate plane, and the orthographic projection of the first sub-line segment 700b1 on the display substrate plane overlaps with the orthographic projection, on the display substrate plane, of any one of the following: an initial signal line 31 and a plate connection line 35.

In an exemplary embodiment, the initial signal lines 31 and the plate connection lines 35 are both located in the second conductive layer, the first power supply lines VDD are located in the third conductive layer, and the data fanout lines 700 are located in the fourth conductive layer.

The process of preparing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials. Deposition may be implemented by adopting any one or more of sputtering, evaporation and chemical vapor deposition. Coating may be implemented by adopting any one or more of spray coating, spin coating and inkjet printing, and etching may be implemented by adopting any one or more of dry etching and wet etching, which are not limited in the present disclosure. "Thin film" refers to a layer of thin film formed by a certain material on a base through deposition, coating or other processes. If a "thin film" does not need a patterning process in the whole preparing process, the "thin film" may also be called a "layer". If a "thin film" needs a patterning process in the whole preparing process, it is called "thin film" before the patterning process and "layer" after the patterning process. A "layer" obtained after a patterning process includes at least one "pattern". "A and B are disposed in the same layer" in the present disclosure means that A and B are formed at the same time through the same patterning process, and the "thickness" of the film layer is the size of the film layer in a direction perpendicular to the display substrate. In an exemplary embodiment of the present disclosure, "an orthographic projection of B is within the range of an orthographic projection of A" means that the boundary of the orthographic projection of B falls within the boundary range of the orthographic projection of A, or the boundary of the orthographic projection of A overlaps with the boundary of the orthographic projection of B. "An orthographic projection of A includes an orthographic projection of B" means that a boundary of the orthographic projection of B falls within a range of boundary of the orthographic projection of A, or the boundary of the orthographic projection of A overlaps with the boundary of the orthographic projection of B.

In an exemplary embodiment, the preparation process of the display substrate may include the following operations.

Figure 21A:
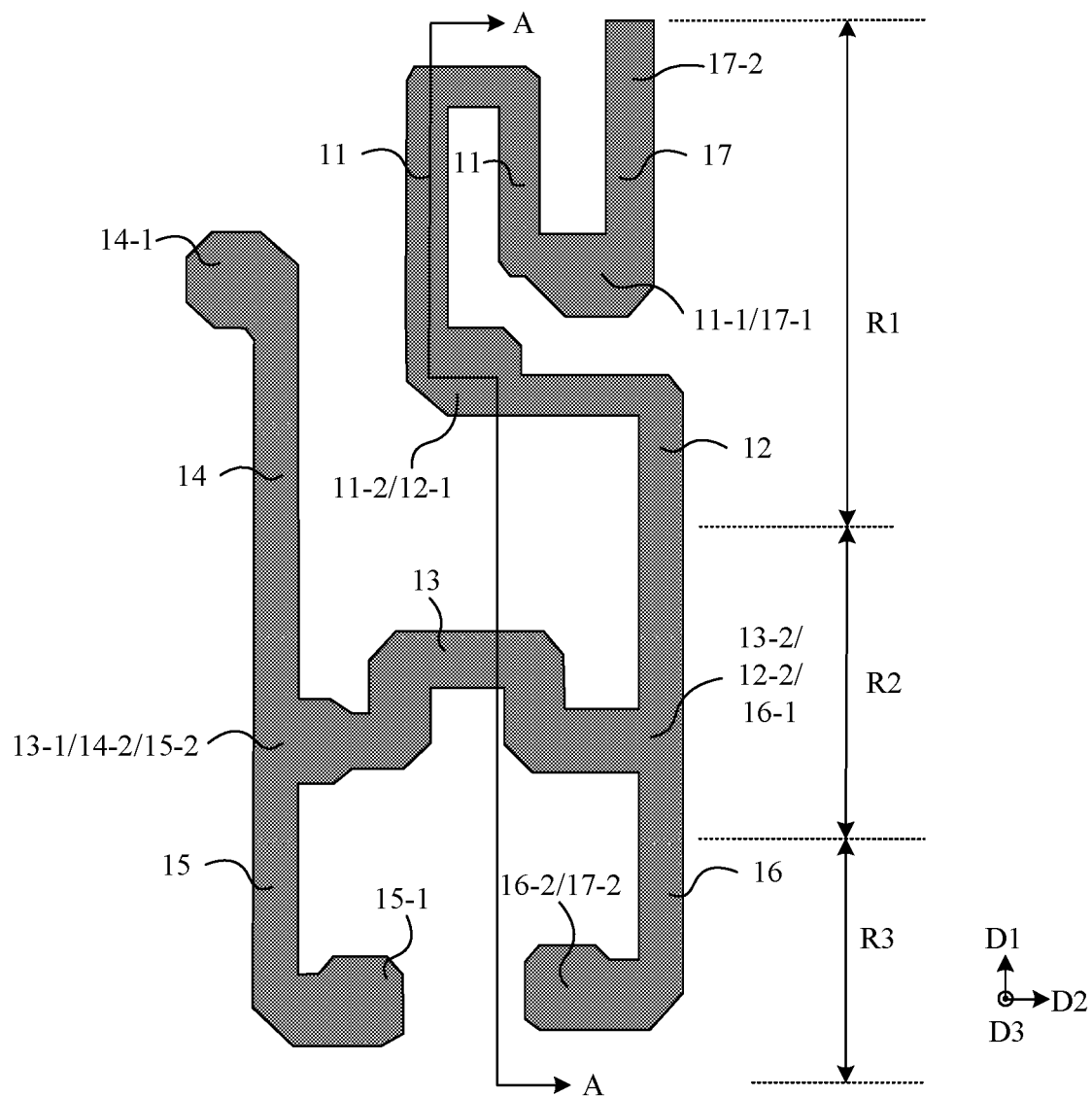
FIG. 21a is a schematic diagram obtained after a semiconductor layer pattern of a display substrate is formed according to the present disclosure.
Figure 21B:
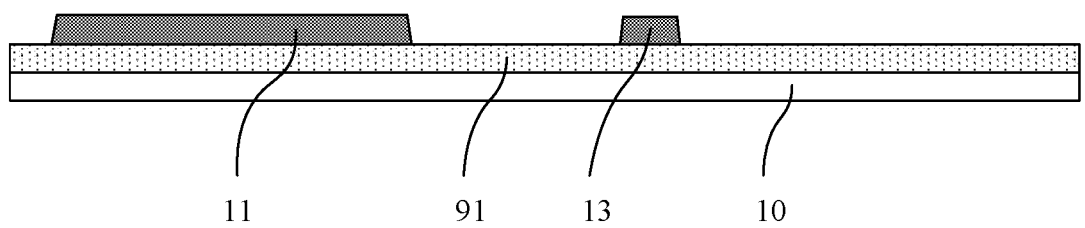

(11) A semiconductor layer pattern is formed. In an exemplary embodiment, the operation of forming the semiconductor layer pattern may include: a first insulating thin film and a semiconductor thin film are sequentially deposited on a base substrate, the semiconductor thin film is patterned through a patterning process to form a first insulating layer that covers the base substrate and form a semiconductor layer arranged on the first insulating layer, as shown in FIG. 21a and FIG. 21b, and FIG. 21b is a sectional view along a direction A-A in FIG. 21a.

In an exemplary embodiment, the semiconductor layer of each sub-pixel may include a first active layer 11 of the first transistor T1 to a seventh active layer 17 of the seventh transistor T7, and the first active layer 11 to the seventh active layer 17 are of an integral structure connected to one another.

In an exemplary embodiment, a first region R1 may include at least part of the first active layer 11 of the first transistor T1, a second active layer 12 of the second transistor T2, a fourth active layer 14 of the fourth transistor T4, and the seventh active layer 17 of the seventh transistor T7. The second region R2 may include at least part of a third active layer 13 of the third transistor T3. The third region R3 may include at least part of a fifth active layer 15 of the fifth transistor T5, and a sixth active layer 16 of the sixth transistor T6. The first active layer 11 and the seventh active layer 17 are arranged on a side, away from the second region R2, in the first region R1. The second active layer 12 and the fourth active layer 14 are arranged on a side, adjacent to the second region R2, in the first region R1.

In an exemplary embodiment, the first active layer 11 may be n-shaped, the second active layer 12 may be 7-shaped, the third active layer may be arranged in a manner like a Chinese character ' 几 ', the fourth active layer 14 may be 1-shaped, and the fifth active layer 15, the sixth active layer 16 and the seventh active layer 17 may be L-shaped.

In an exemplary embodiment, the active layer of each transistor includes a first region, a second region, and a channel region located between the first region and the second region. In an exemplary embodiment, a first region 11-1 of the first active layer 11 also serves as a first region 17-1 of the seventh active layer 17; a second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a second region 16-2 of the sixth active layer 16 also serves as a second region 17-2 of the seventh active layer 17. In the exemplary embodiment, a first region 14-1 of the fourth active layer 14 and a first region 15-1 of the fifth active layer 15 are arranged separately.

In an exemplary embodiment, the third active layer 13 of the third transistor includes a first region 13-1, a second region 13-2, and a channel region. The channel region of the third active layer 13 is arranged between the first region 13-1 and the second region 13-2, and two ends of the channel region are respectively connected to the first region 13-1 and the second region 13-2. The first region 13-1 of the third active layer 13 is also used as a second region 14-2 of the fourth active layer 14 and a second region 15-2 of the fifth active layer 15, that is, the first region 13-1 of the third active layer 13, the second region 14-2 of the fourth active layer 14, and the second region 15-2 of the fifth active layer 15 are connected to one another. The second region 13-2 of the third active layer 13 also serves as the second region 12-2 of the second active layer 12 and the first region 16-1 of the sixth active layer 16 simultaneously, that is, the second region 13-2 of the third active layer 13, the second region 12-2 of the second active layer 12 and the first region 16-1 of the sixth active layer 16 are connected to each other.

As shown in FIG. 21b, after this process, the display substrate includes a first insulating layer 91 arranged on the base substrate 10 and the semiconductor layer arranged on the first insulating layer 91. The semiconductor layer may include the first active layer 11 and the third active layer 13.

Figure 22A:
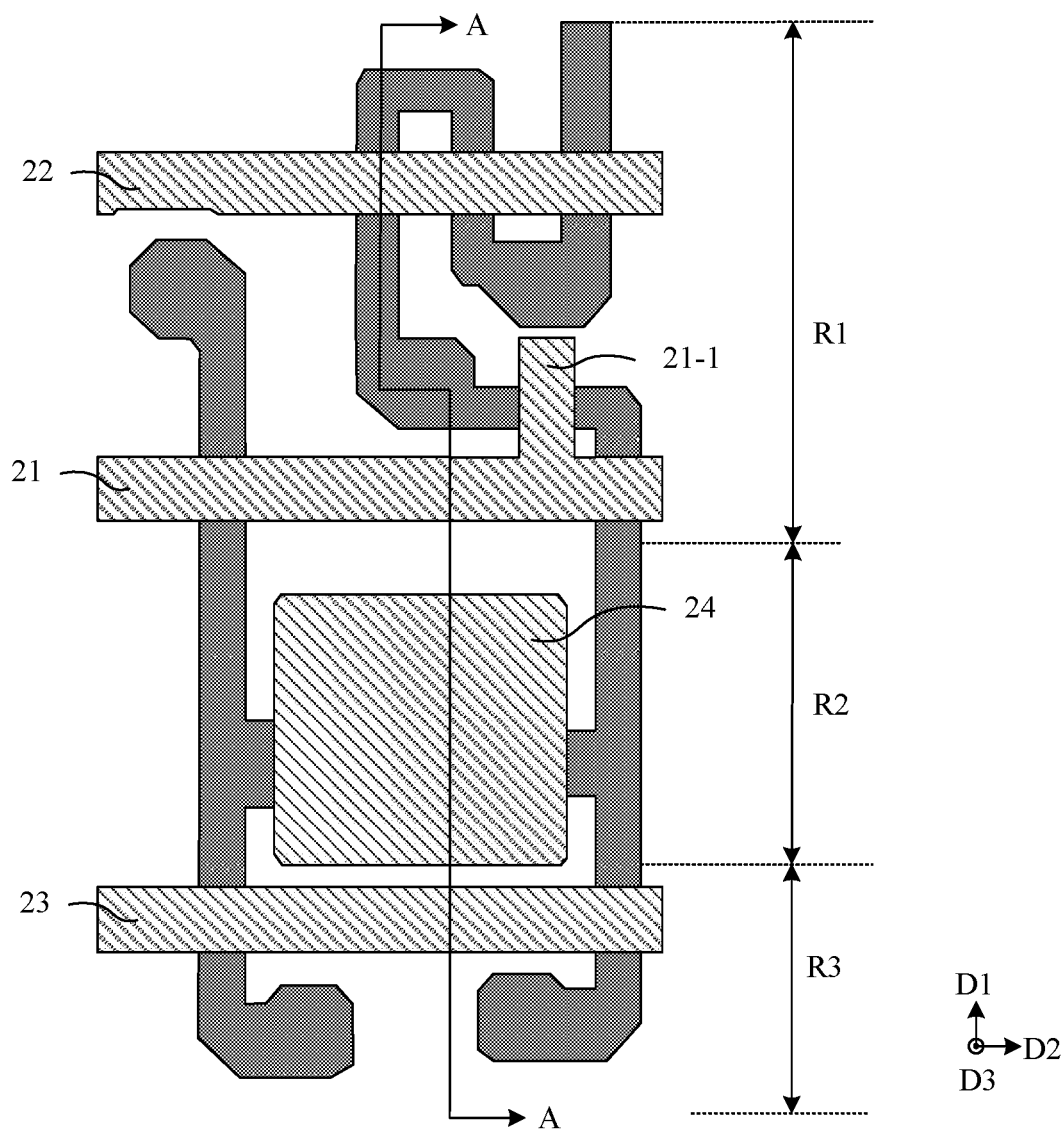
FIG. 22a is a schematic diagram obtained after a first conductive layer pattern of a display substrate is formed according to the present disclosure.
Figure 22B:
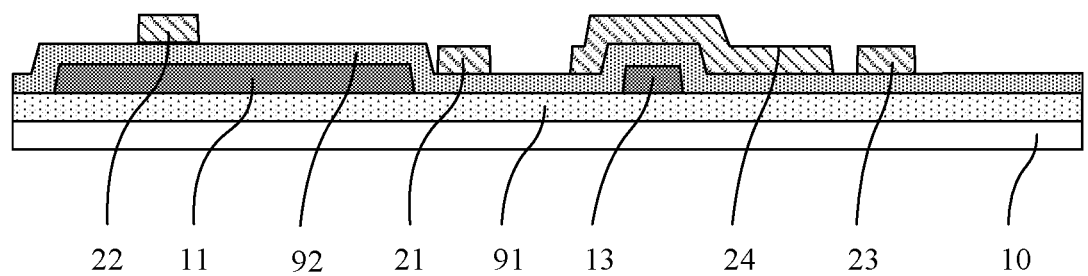

(12) A first conducting layer pattern is formed. In an exemplary embodiment, the operation of forming the first conductive layer pattern may include: a second insulating thin film and a first metal thin film are sequentially deposited on the base substrate on which the above-mentioned pattern is formed, and the first metal thin film is patterned through a patterning process to form a second insulating layer that covers the semiconductor layer pattern and form a first conductive layer pattern arranged on the second insulating layer; wherein the first conductive layer pattern at least includes the first scanning signal line 21, the second scanning signal line 22, the light emitting control line 23, and the first plate 24 of the storage capacitor, as shown in FIG. 22a and FIG. 22b, and FIG. 22b is a sectional view along a direction A-A in FIG. 22a. In an exemplary embodiment, the first conductive layer may be called a first metal gate layer (GATE1).

In an exemplary embodiment, the first scanning signal line 21, the second scanning signal line 22, and the light emitting control line 23 extend in the second direction D2. The first scanning signal line 21 and the second scanning signal line 22 are arranged in the first region R1. The second scanning signal line 22 is located on a side of the first scanning signal line 21 away from the second region R2. The light emitting control line 23 is arranged in the third region R3. The first plate 24 of the storage capacitor is arranged in the second region R2 and located between the first scanning signal line 21 and the light emitting control line 23.

In an exemplary embodiment, the first electrode plate 24 may be rectangular, and rectangle corners may be set with chamfer. There is an overlap region between an orthographic projection of the first electrode plate 24 on the substrate and an orthographic projection of the third active layer of the third transistor T3 on the substrate. In an exemplary embodiment, the first electrode plate 24 also serves as a gate electrode of the third transistor T3.

In an exemplary embodiment, an overlap region between the first scanning signal line 21 and the fourth active layer of the fourth transistor T4 is used as the gate electrode of the fourth transistor T4. The first scanning signal line 21 is provided with a gate block 21-1 protruding towards the second scanning signal line 22. There is an overlap region between an orthographic projection of the gate block 21-1 on the base substrate and an orthographic projection of the second active layer of the second transistor T2 on the base substrate. The overlap region between the first scanning signal line 21 and the gate block 21-1 and the second active layer of the second transistor T2 is used as a gate electrode of a double-gate structure of the second transistor T2. A region where the second scan signal line 22 overlaps the first active layer of the first transistor T1 serves as a gate electrode of a double-gate structure of the first transistor T1; a region where the second scan signal line 22 overlaps the seventh active layer of the seventh transistor T7 serves as a gate electrode of the seventh transistor T7; a region where the light emission control line 23 overlaps the fifth active layer of the fifth transistor T5 serves as a gate electrode of the fifth transistor T5; and a region where the light emission control line 23 overlaps the sixth active layer of the sixth transistor T6 serves as a gate electrode of the sixth transistor T6.

In an exemplary embodiment, after the first conductive layer pattern is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

As shown in FIG. 22b, after this process, the display substrate includes the first insulating layer 91 arranged on the base substrate 10, the semiconductor layer arranged on the first insulating layer 91, the second insulating layer 92 that covers the semiconductor layer, and the first conductive layer arranged on the second insulating layer 92. The semiconductor layer may include the first active layer 11 and the third active layer 13, and the first conductive layer may include the first scanning signal line 21, the second scanning signal line 22, the light emitting control line 23 and the first plate 24 of the storage capacitor.

Figure 23A:
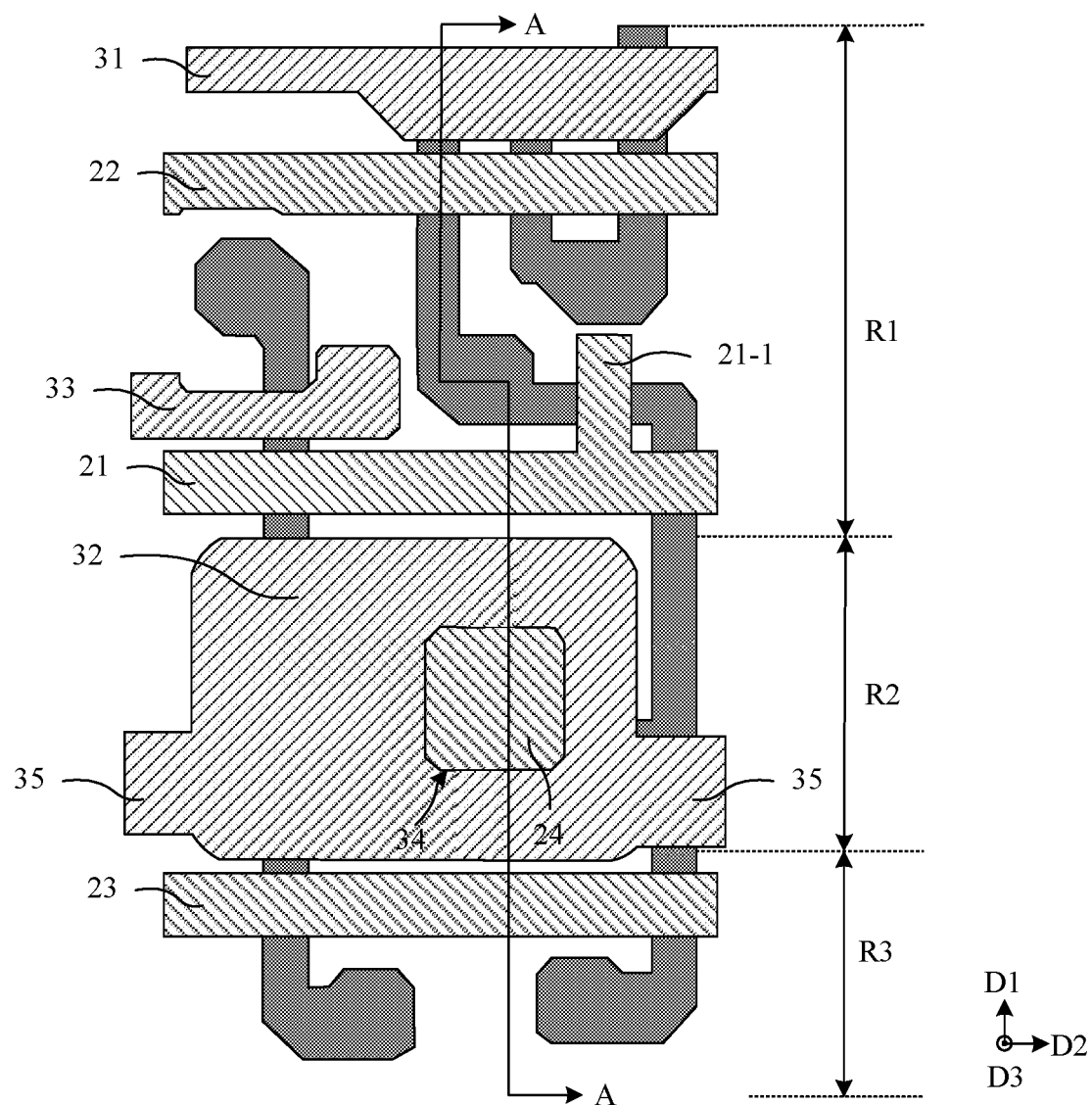
FIG. 23a is a schematic diagram obtained after a second conductive layer pattern of a display substrate is formed according to the present disclosure.
Figure 23B:
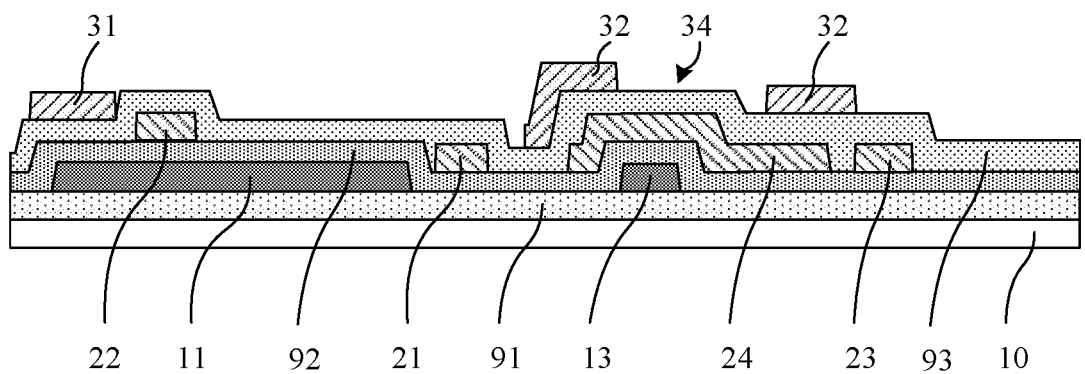

(13) A second conductive layer pattern is formed. In an exemplary embodiment, the operation of forming the second conductive layer pattern may include: a third insulating thin film and a second metal thin film are sequentially deposited on the base substrate on which the above-mentioned patterns are formed, and the second metal thin film is patterned through a patterning process to form a third insulating layer 93 that covers the first conductive layer and form a second conductive layer pattern arranged on the third insulating layer 93. The second conductive layer pattern at least includes: an initial signal line 31, a second plate 32 of the storage capacitor, a shield electrode 33, and a plate connection line 35, as shown in FIG. 23a and FIG. 23b, and FIG. 23b is a sectional view along a direction A-A in FIG. 23a. In an exemplary embodiment, the second conductive layer may be called a second metal gate layer (GATE 2).

As shown in FIG. 23a, in the exemplary embodiment, the initial signal line 31 extending in the second direction D2 is arranged in the first region R1, and located on a side, of the second scanning signal line 22 away from the second region R2. The second plate 32 of the storage capacitor is arranged in the second region R2 and is located between the first scanning signal line 21 and the light emitting control line 23. The shield electrode 33 is arranged in the first region R1.

The shield electrode 33 is configured to shield impact of data voltage jump on a critical node, thereby preventing impact of data voltage jump on a potential of a critical node of the pixel driving circuit, and improving the display effect.

In an exemplary embodiment, the initial signal line 31 may be of unequal width, and the width of the initial signal line 31 is a dimension of the initial signal line 31 in the first direction D1. The initial signal line 31 includes a region overlapped with the semiconductor layer and a region not overlapped with the semiconductor layer. A width of the initial signal line 31 in the region not overlapped with the semiconductor layer may be smaller than a width of the initial signal line 31 in the region overlapped with the semiconductor layer.

In an exemplary embodiment, a contour of the second electrode plate 32 may be rectangular, and corners of the rectangle may be set with chamfer. There is an overlap region between an orthographic projection of the second electrode plate 32 on the substrate and an orthographic projection of the first electrode plate 24 on the substrate. The second plate 32 is provided with an opening 34, and the opening 34 may be located in the middle of the second region R2. The opening 34 may be rectangular, and the second electrode plate 32 forms an annular structure. The opening 34 exposes the third insulating layer 93 covering the first electrode plate 24, and the orthographic projection of the first electrode plate 24 on the substrate contains an orthographic projection of the opening 34 on the substrate. In an exemplary embodiment, the opening 34 is configured to accommodate a first via subsequently formed, which is located in the opening 34 and exposes the first electrode plate 24, so that a second electrode of the first transistor T1 subsequently formed is connected to the first electrode plate 24.

In an exemplary embodiment, the plate connection line 35 is arranged between the second plates 32 of adjacent sub-pixels in the second direction D2, wherein a first end of the plate connection line 35 is connected to the second plate 32 of the present sub-pixel, and a second end of the plate connection line 35 extends in the second direction D2 or a direction opposite to the second direction D2, and is connected to the second plates 32 of the adjacent sub-pixels, that is, the plate connection line 35 is arranged such that the second plates of the adjacent sub-pixels in the first second D2 are connected to each other. In an exemplary embodiment, second electrode plates in a sub-pixel row form an integrated structure connected to each other through the electrode plate connection line 35, and the second electrode plates in the integrated structure may be reused as power supply signal lines, thus ensuring that a plurality of second electrode plates in a sub-pixel row have a same potential, which is beneficial to improving uniformity of the panel, avoiding a poor display of the display substrate and ensuring a display effect of the display substrate.

In an exemplary embodiment, an orthographic projection of an edge of the second plate 32 adjacent to the first region R1 on the base substrate is overlapped with an orthographic projection of a boundary line between the first region R1 and the second region R2 on the base substrate. An orthographic projection of an edge of the second plate 32 adjacent to the third region R3 on the base substrate is overlapped with an orthographic projection of a boundary line between the second region R2 and the third region R3, that is, a length of the second plate 32 is equal to a length of the second region R2, wherein the length of the second plate 32 refers to a dimension of the second plate 32 in the second direction D2.

As shown in FIG. 23b, in a plane perpendicular to the base substrate, the first insulating layer 91 is arranged on the base substrate 10, the semiconductor layer is arranged on the first insulating layer 91, the second insulating layer 92 covers the semiconductor layer, the first conductive layer is arranged on the second insulating layer 92, the third insulating layer 93 covers the first conductive layer, the second conductive layer is arranged on the third insulating layer 93, and the second conductive layer at least includes the initial signal line 31 and the second plate 32 of the storage capacitor. The second plate 32 of the storage capacitor is provided with the opening 34, wherein the opening 34 exposes the third insulating layer 93 that covers the first plate 24, and there is an overlap region between the orthographic projection of the second plate 32 on the base substrate and the orthographic projection of the first plate 24 on the base substrate.

(14) A fourth insulating layer pattern is formed. In an exemplary embodiment, the operation of forming the fourth insulating layer pattern may include: a fourth insulating thin film is arranged on the base substrate on which the above-mentioned patterns are formed, the fourth insulating thin film is patterned through a patterning process to form a fourth insulating layer that covers the second conductive layer. The fourth insulating layer is provided with multiple vias, wherein the multiple vias at least include: a first via V1, a second via V2, a third via V3, a fourth via V4, a fifth via V5, a sixth via V6, a seventh via V7, an eighth via V8, and a ninth via V9, as shown in FIG. 24a and FIG. 24b, and FIG. 24b is a sectional view along a direction A-A in FIG. 24a.

Figure 24A:
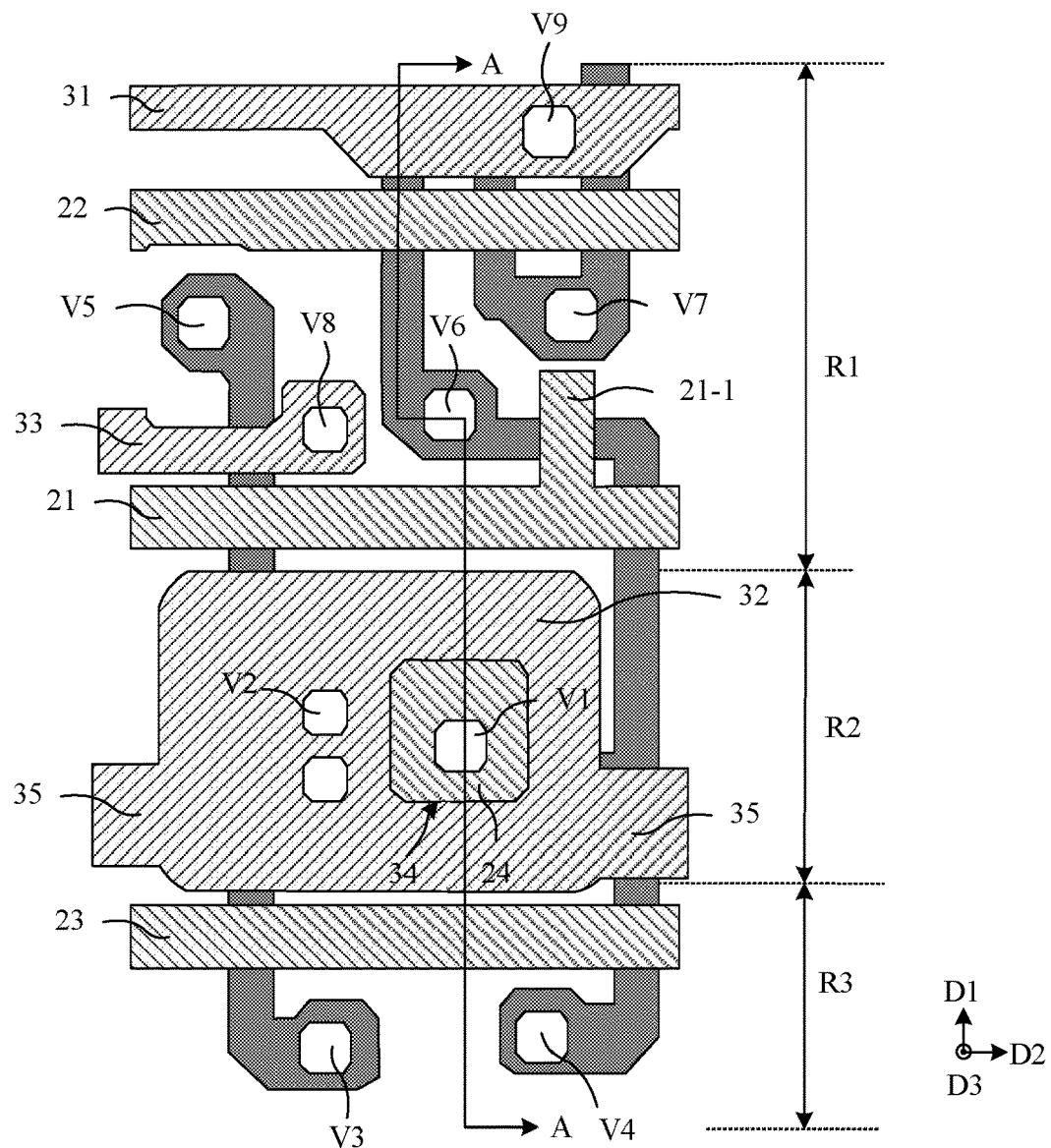
FIG. 24a is a schematic diagram obtained after a fourth insulating layer pattern of a display substrate is formed according to the present disclosure.
Figure 24B:
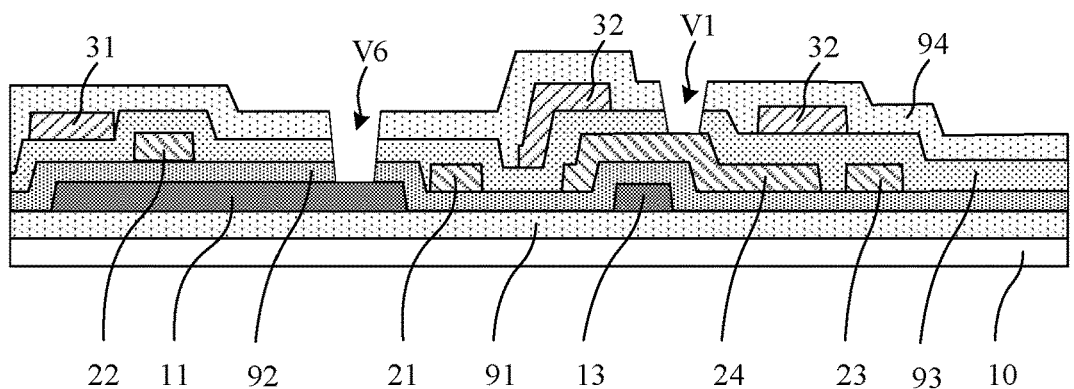

As shown in FIG. 24a, in an exemplary embodiment, the first via V1 is located in the opening 34 of the second plate 32, and an orthographic projection of the first via V1 on the base substrate is located within a range of the orthographic projection of the opening 34 on the base substrate. The fourth insulating layer and the third insulating layer in the first via V1 are etched off to expose a surface of the first plate 24. The first via V1 is configured such that the second electrode of the first transistor T1 to be formed subsequently is connected to the first plate 24 through the via.

In an exemplary embodiment, the second via V2 is located in a region where the second plate 32 is located, and an orthographic projection of the second via V2 on the base substrate is within a range of the orthographic projection of the second plate 32 on the base substrate. The fourth insulating layer in the second via V2 is etched off to expose a surface of the second plate 32. The second via V2 is configured such that the first power supply line to be formed subsequently is connected to the second plate 32 through the via. In an exemplary embodiment, there may be multiple second vias V2 serving as power supply vias, and the multiple second vias V2 may be sequentially arranged in the first direction D1, thereby improving reliability of connection of the first power supply line with the second plate 32.

In an exemplary embodiment, the third via V3 is located in the third region R3, and the fourth insulating layer, the third insulating layer, and the second insulating layer in the third via V3 are etched off to expose a surface of the first region of the fifth active layer. The third via V3 is configured such that the first power supply line to be formed subsequently is connected to the fifth active layer through the via.

In an exemplary embodiment, the fourth via V4 is located in the third region R3, and the fourth insulating layer, the third insulating layer, and the second insulating layer in the fourth via V4 are etched off to expose a surface of a second region of the sixth active layer (i.e., the second region of the seventh active layer). The fourth via V4 is configured such that a second electrode of the sixth transistor T6 subsequently formed is connected to the sixth active layer through the via V4 and a second electrode of the seventh transistor T7 subsequently formed is connected to the seventh active layer through the via V4.

In an exemplary embodiment, the fifth via V5 is located in the first region R1, and the fourth insulating layer, the third insulating layer, and the second insulating layer in the fifth via V5 are etched off to expose a surface of a first region of the fourth active layer. The fifth via V5 is configured such that a data line to be formed subsequently is connected to the fourth active layer through the via, here the fifth via V5 is called a data writing hole.

In an exemplary embodiment, the sixth via V6 is located in the first region R1, and the fourth insulating layer, the third insulating layer, and the second insulating layer in the sixth via V6 are etched off to expose a surface of a second region of the first active layer (i.e., first region of the second active layer). The sixth via V6 is configured such that a second electrode of the first transistor T1 subsequently formed is connected to the first active layer through the sixth via V6 and a first electrode of the second transistor T2 subsequently formed is connected to the second active layer through the sixth via V6.

In an exemplary embodiment, the seventh via V7 is located in the first region R1, and the fourth insulating layer, the third insulating layer, and the second insulating layer in the seventh via V7 are etched off to expose a surface of a first region of the seventh active layer (i.e., the first region of the first active layer). The seventh via V7 is configured such that a first electrode of the seventh transistor T7 subsequently formed is connected to the seventh active layer through the via V7 and a first electrode of the first transistor T1 subsequently formed is connected to the first active layer through the via V7.

In an exemplary embodiment, the eighth via V8 is located in the first region R1, and the fourth insulating layer in the eighth via V8 is etched off to expose a surface of the shield electrode 33 The eighth via V8 is configured such that the first power supply line to be formed subsequently is connected to the shield electrode 33 through the via.

In an exemplary embodiment, the ninth via V9 is located in the first region R1, and the fourth insulating layer in the ninth via V9 is etched off to expose a surface of the initial signal line 31. The ninth via V9 is configured such that the first electrode of the seventh transistor T7 (i.e., the first electrode of the first transistor T1) to be formed subsequently is connected to the initial signal line 31 through the via.

As shown in FIG. 24b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is disposed on the second insulating layer 92. The third insulating layer 93 covers the first conductive layer. The second conductive layer is arranged on the third insulating layer 93. The fourth insulating layer 94 covers the second conductive layer, and the fourth insulating layer 94 is provided with multiple vias. The multiple vias at least include a first via V1 and a sixth via V6. The fourth insulating layer 94 and the third insulating layer 93 in the first via V1 are etched off to expose a surface of the second plate 32. The fourth insulating layer 94, the third insulating layer 93, and the second insulating layer 92 in the sixth via V6 are etched off to expose a surface of the first active layer 11.

Figure 25A:
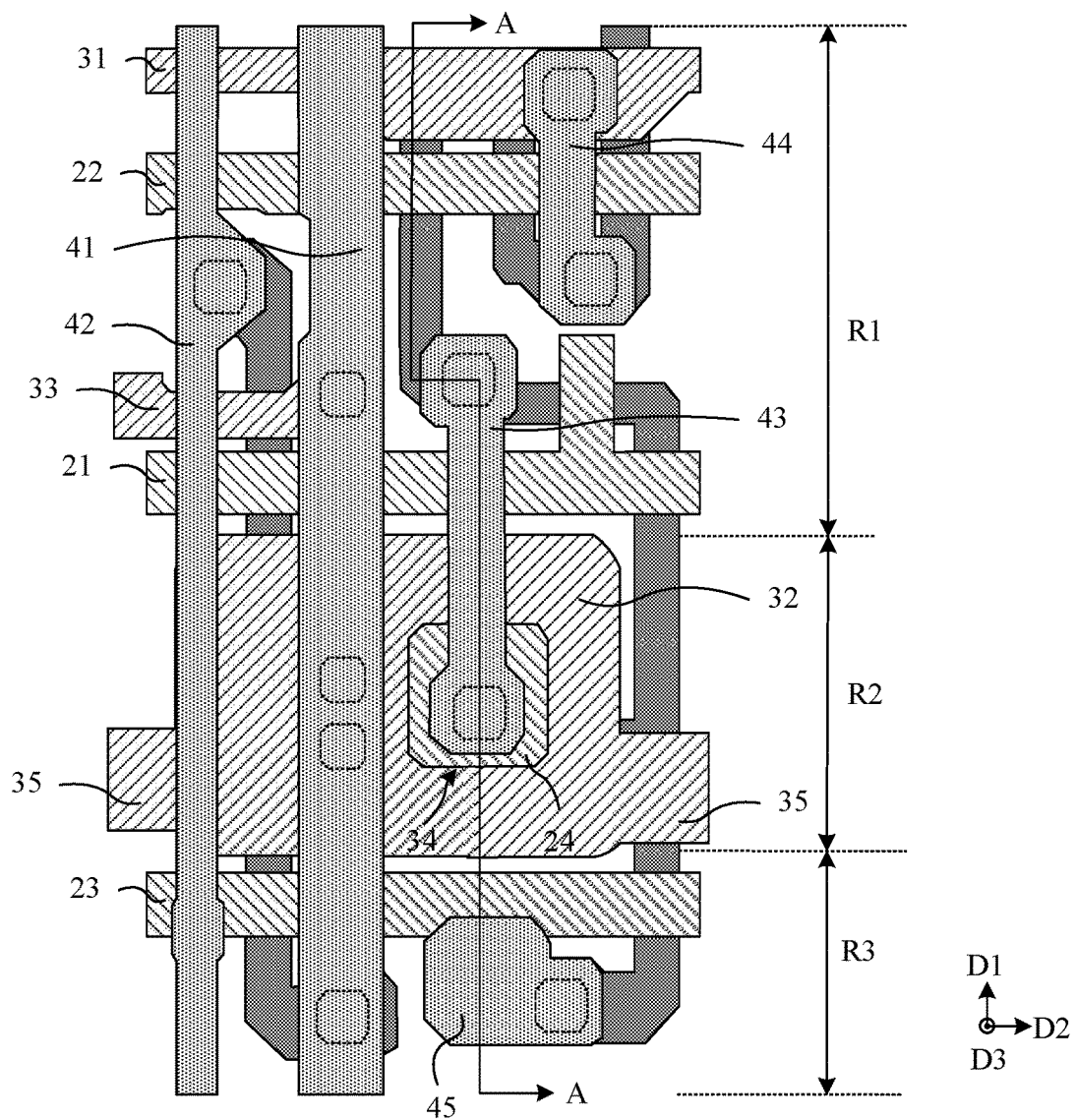
FIG. 25a is a schematic diagram obtained after a third conductive layer pattern of a display substrate is formed according to the present disclosure.
Figure 25B:
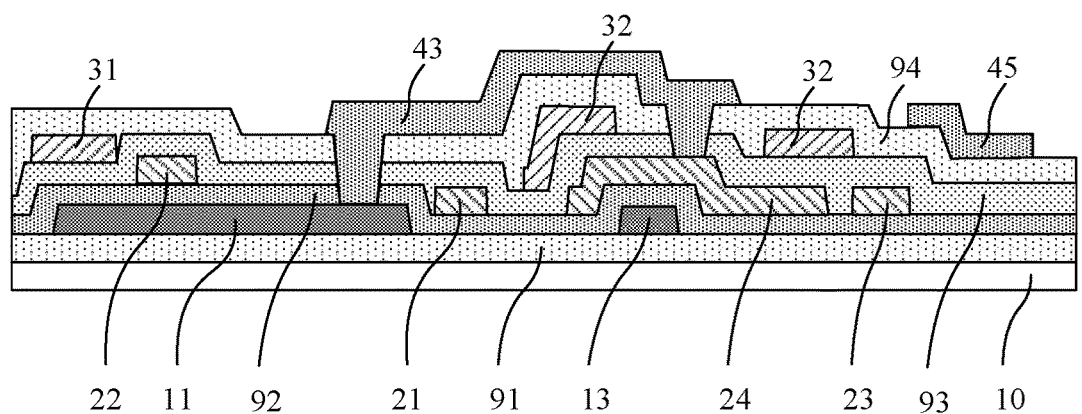

(15) A third conductive layer pattern is formed. In an exemplary embodiment, the operation of forming the third conductive layer pattern may include: a third insulating thin film is deposited on the base substrate on which the above-mentioned patterns are formed, and the third metal thin film is patterned through a patterning process to form a third conductive layer arranged on the fourth insulating layer. The third conductive layer pattern at least includes: a first power supply line 41, a data line 42, a first connection electrode 43, a second connection electrode 44, and a third connection electrode 45, as shown in FIG. 25a and FIG. 25b, and FIG. 25b is a sectional view along a direction A-A in FIG. 25a. In an exemplary embodiment, the third conductive layer may be called a first metal source-drain layer (SD1).

As shown in FIG. 25a, in an exemplary embodiment, the first power supply line 41 extends in the first direction D1. On the one hand, the first power supply line 41 is connected to the second plate 32 through the second via V2, and on the other hand, the first power supply line 41 is connected to the shield electrode 33 through the eighth via V8, and furthermore, is connected to the fifth active layer through the third via V3, so that the shield electrode 33 and the second plate 32 have a same potential as the first power supply line 41. Since there is an overlap region between an orthographic projection of the shield electrode 33 on the base substrate and an orthographic projection of the data line to be formed subsequently on the base substrate, and the shield electrode 33 is connected to the first power supply line 41, so that the impact of data voltage jump on a critical node is effectively shielded, thus preventing impact of data voltage jump on the potential of the critical node of the pixel driving circuit, and improving the display effect.

In an exemplary embodiment, the data line 42 extends in the first direction D1, and the data line 42 is connected to the first region of the fourth active layer through the fifth via V5, so that a data signal transmitted by the data line 42 is written into the fourth transistor T4.

In an exemplary embodiment, the first connection electrode 43 extends in the first direction D1. A first end of the first connection electrode is connected to the second region of the first active layer (i.e., the first region of the second active layer) through the sixth via V6, and a second end of the first connection electrode is connected to the first plate 24 through the first via V1, so that the first plate 24, the second electrode of the first transistor T1 and the first electrode of the second transistor T2 have the same potential. In an exemplary embodiment, the first connection electrode 43 may be used as the second electrode of the first transistor T1 and the first electrode of the second transistor T2.

In an exemplary embodiment, the second connection electrode 44 extends in the first direction D1, and has a first end connected to the initial signal line 31 through the ninth via V9, and a second end is connected to the first region of the seventh active layer (i.e., the first region of the first active layer) through the seventh via V7, so that the first electrode of the seventh transistor T7 and the first electrode of the first transistor T1 have a same potential as the initial signal line 31. In an exemplary embodiment, the second connection electrode 44 may be used as the first electrode of the seventh transistor T7 and the first electrode of the first transistor T1.

In an exemplary embodiment, the third connection electrode 45 is connected to the second region of the sixth active layer (i.e., the second region of the seventh active layer) through the fourth via V4, so that the second electrode of the sixth transistor T6 and the second electrode of the seventh transistor T7 have a same potential. In an exemplary embodiment, the third connection electrode 45 may be used as the second electrode of the sixth transistor T6 and the second electrode of the seventh transistor T7. In an exemplary embodiment, the third connection electrode 45 is configured to be connected to an anode to be formed subsequently.

In an exemplary embodiment, the first power supply line 41 and the data line 42 may be straight lines of an equal width, or straight lines of unequal widths.

As shown in FIG. 25b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94, and the third conductive layer at least includes the first connection electrode 43 and the third connection electrode 45. The first connection electrode 43 is connected to the first plate 24 and the first active layer 11 of a first transistor T1 through the first via V1 and the sixth via V6, respectively.

Figure 26A:
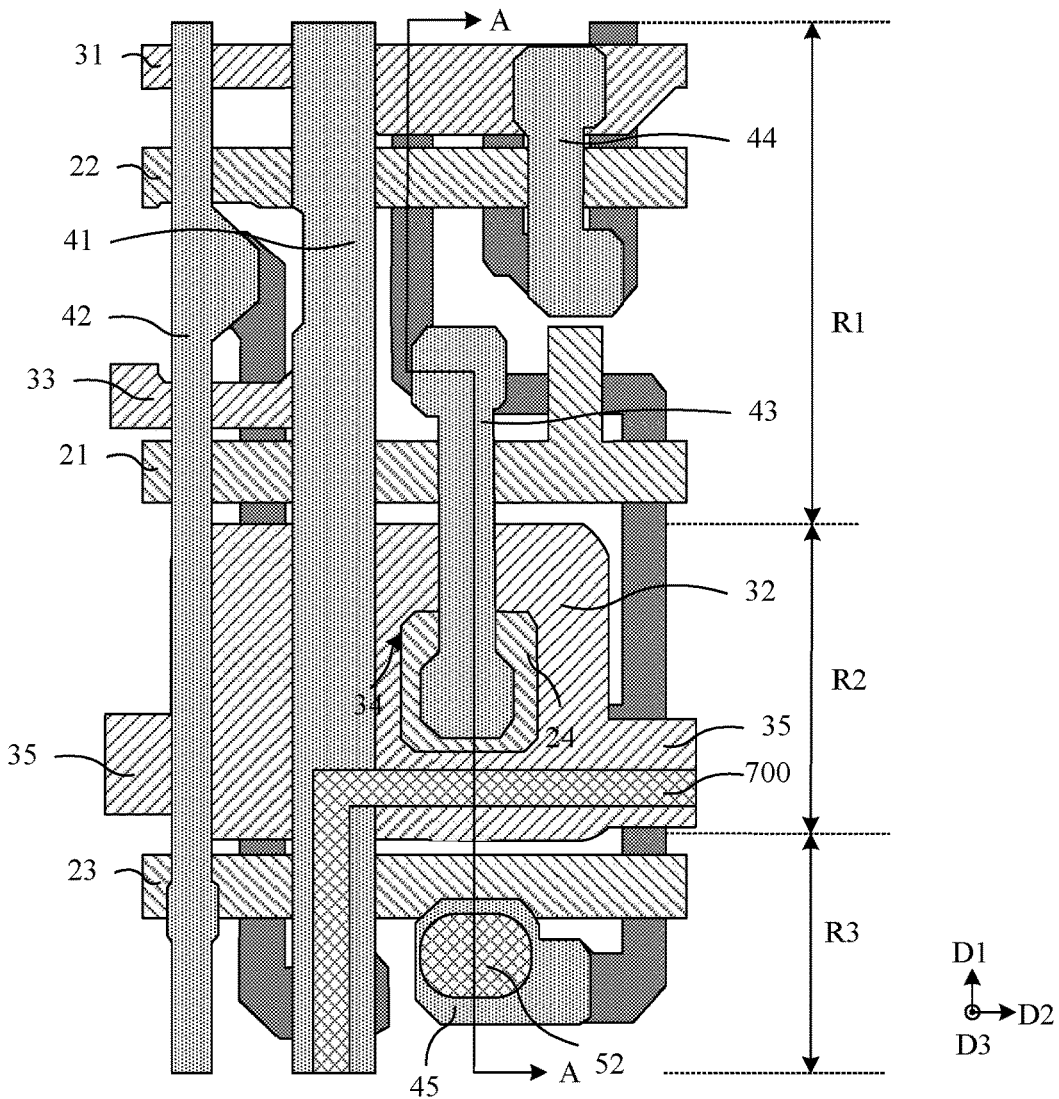
FIG. 26a is a schematic diagram obtained after a fourth conductive layer pattern of a display substrate is formed according to the present disclosure.
Figure 26B:
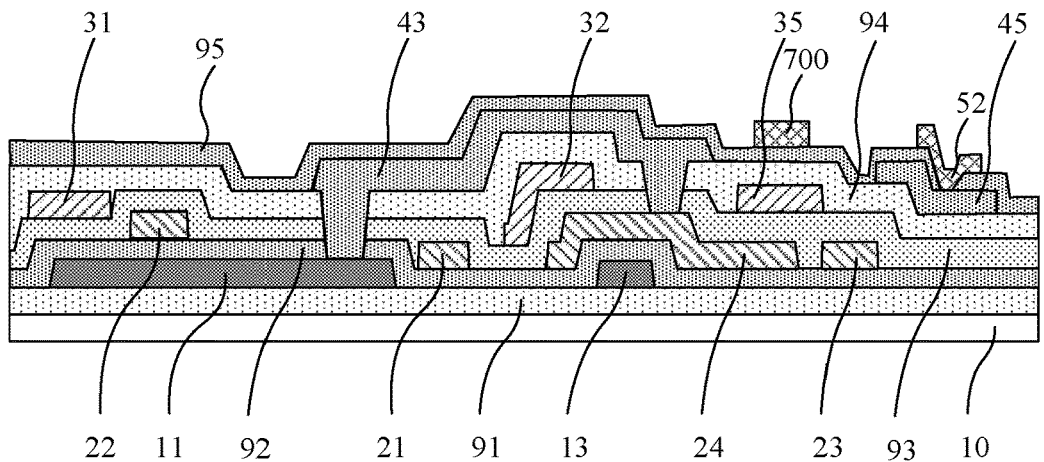

(16) A fourth conductive layer pattern is formed. In an exemplary embodiment, the operation of forming the fourth conductive layer pattern may include: a fifth insulating thin film and a fourth metal thin film are sequentially deposited on the base substrate on which the above-mentioned patterns are formed, and the fourth metal thin film is patterned through a patterning process to form a fifth insulating layer 95 that covers the third conductive layer and form a fourth conductive layer pattern arranged on the fifth insulating layer 95. The fourth conductive layer pattern at least includes: a data fanout line 700 and a fourth connection electrode 52, as shown in FIG. 26a and FIG. 26b, and FIG. 26b is a sectional view along a direction A-A in FIG. 26a. In an exemplary embodiment, the fourth conductive layer may be called a second metal source-drain layer (SD2).

In an exemplary embodiment, the fifth insulating layer 95 is provided with a tenth via (not shown in the figure), the tenth via exposes the surface of the third connection electrode 45, and the fourth connection electrode 52 is connected with the third connection electrode 45 through the tenth via.

In an exemplary embodiment, the orthographic projection of the data fanout line 700 on the base substrate is located within the range of orthographic projection of any one or more of the following: the first power supply line 41, the plate connection line 35 and the initial signal line 31, on the base substrate.

In an embodiment of the present disclosure, by overlapping the data fanout line 700 with some signal lines with fixed potential (the first power supply line 41, the plate connection line 35 and the initial signal line 31, etc.), the potential change on the data fanout line 700 can be prevented from causing the potential jump of other signal lines in the pixel circuit when the data signal is written, and thus display quality can be improved.

In an exemplary embodiment, as shown in FIG. 26a, the orthographic projection of the data fanout line 700 on the base substrate is located within the range of orthographic projection of the first power supply line 41 and/or the plate connection line 35 on the base substrate.

Since the plate connection line 35 is connected with the first power supply line 41, the voltage in the first power supply line 41 is a constant positive voltage, and the range of data voltage is usually positive voltage, therefore, the potential difference between the data fanout line 700 and the first power supply line 41 (or the plate connection line 35) is small, and the load is relatively small when a data signal is written, thus further reducing the signal crosstalk of the data fanout line to other signal lines.

(17) A flat layer pattern is formed. In an exemplary embodiment, the operation of forming the planarization layer pattern may include: the base substrate on which the foregoing patterns are formed is coated with a planarization thin film, and the planarization thin film is patterned through a patterning process to form a planarization layer covering the third conductive layer. The planarization layer is provided with an eleventh via V11, as shown in FIG. 27a and FIG. 27b, and FIG. 27b is a sectional view along a direction A-A in FIG. 27a.

Figure 27A:
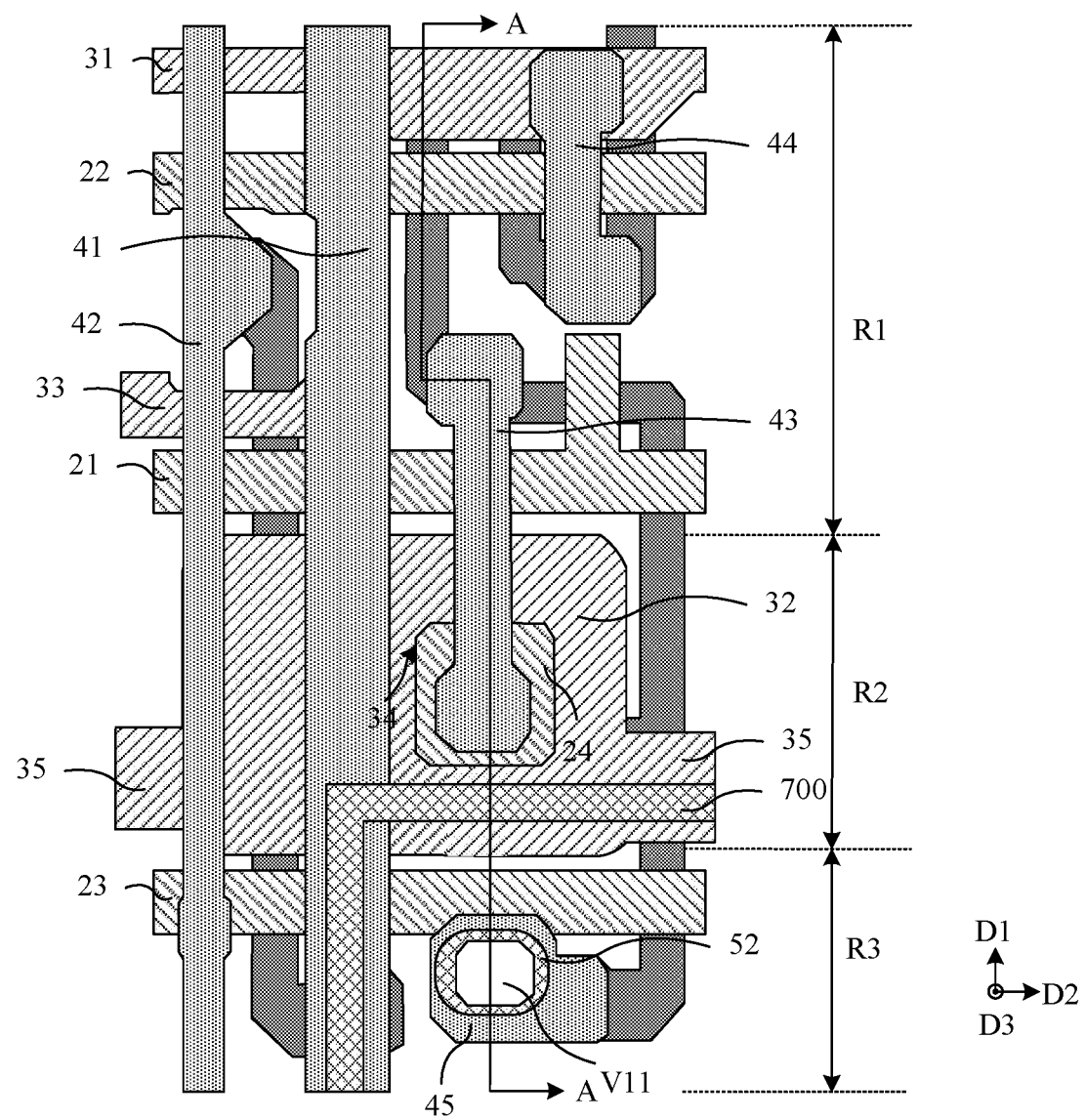
FIG. 27a is a schematic diagram obtained after a planarization layer pattern of a display substrate is formed according to the present disclosure.

As shown in FIG. 27a, the tenth via V10 is located in a region where the fourth connection electrode 52 is located, the planarization layer in the eleventh via V11 is removed to expose a surface of the fourth connection electrode 52, and the eleventh via V11 is configured such that the anode to be formed subsequently is connected to the fourth connection electrode 52 through the via.

Figure 27B:
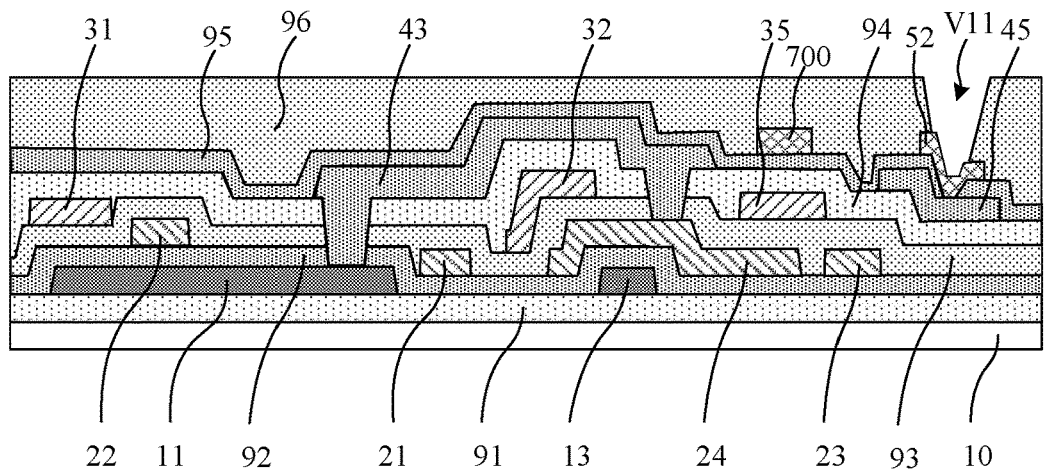

As shown in FIG. 27b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94. The fifth insulating layer 95 covers the third conductive layer. The fourth conductive layer is arranged on the fifth insulating layer 95. The planarization layer 96 covers the fourth conductive layer and is provided with the eleventh via V11, and the planarization layer 95 in the eleventh via V11 is removed to expose a surface of the fourth connection electrode 52.

(18) An anode pattern is formed. In an exemplary embodiment, the operation of forming the anode pattern may include: a transparent conductive thin film is deposited on the base substrate on which the foregoing patterns are formed, and the transparent conductive thin film is patterned through a patterning process to form an anode 71 arranged on the planarization layer, as shown in FIG. 28a and FIG. 28b, and FIG. 28b is a sectional view along a direction A-A in FIG. 28a.

Figure 28A:
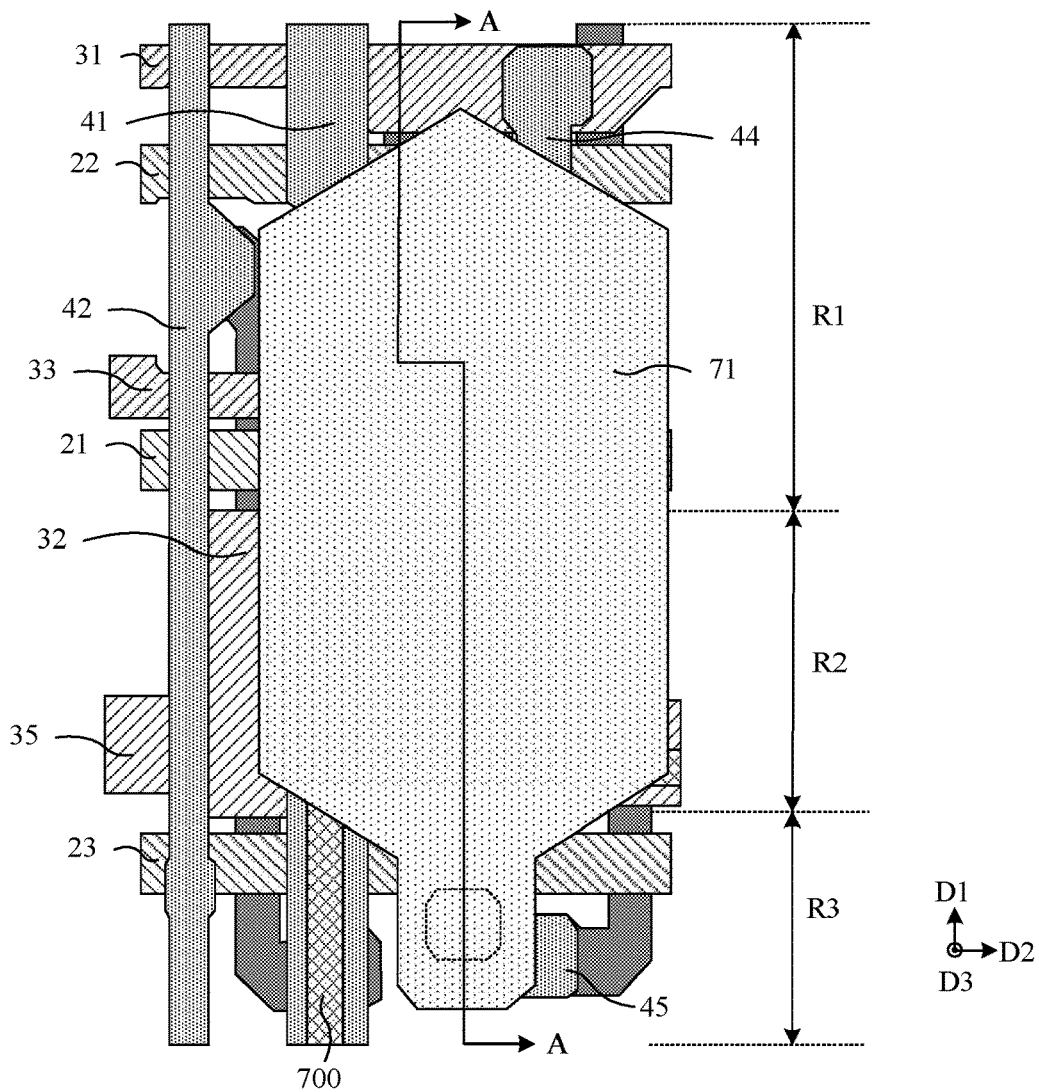
FIG. 28a is a schematic diagram obtained after an anode pattern of a display substrate is formed according to the present disclosure.

As shown in FIG. 28a, the anode 71 may be hexagonal, and the anode 71 is connected to the fourth connection electrode 52 through the eleventh via V11. Since the fourth connection electrode 52 is connected with the third connection electrode 45 through the tenth via, and the third connection electrode 45 is used as the second electrode of the sixth transistor T6 and the second electrode of the seventh transistor T7, the anode 71 is connected to the sixth transistor T6 and the seventh transistor T7, so that the pixel driving circuit can drive the light emitting device to emit light.

Figure 28B:
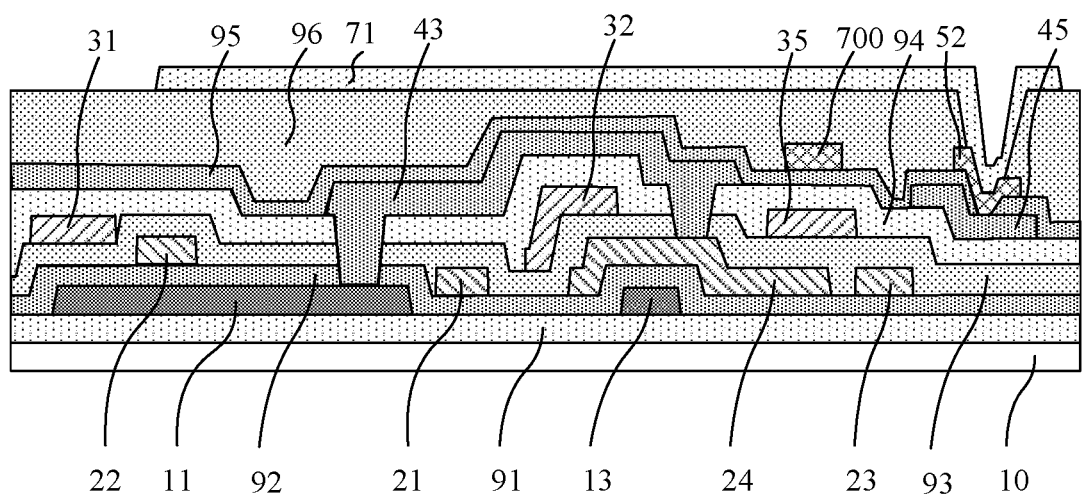

As shown in FIG. 28b, in a plane perpendicular to the base substrate, the first insulating layer 91 is arranged on the base substrate 10. The semiconductor layer is arranged on the first insulating layer 91. The second insulating layer 92 covers the semiconductor layer. The first conductive layer is arranged on the second insulating layer 92. The third insulating layer 93 covers the first conductive layer. The second conductive layer is arranged on the third insulating layer 93. The fourth insulating layer 94 covers the second conductive layer. The third conductive layer is arranged on the fourth insulating layer 94. The fifth insulating layer 95 covers the third conductive layer. The fourth conductive layer is arranged on the fifth insulating layer 95. The planarization layer 96 covers the fourth conductive layer. The anode 71 is arranged on the planarization layer 96, and the anode 71 is connected to the fourth connection electrode 52 through the eleventh via.

In an exemplary embodiment, a subsequent preparation process may include: a pixel definition thin film is coated, and the pixel definition thin film is patterned through a patterning process to form a pixel definition layer. The pixel definition layer of each sub-pixel is provided with a pixel opening, and the anode is exposed through the opening. The organic light emitting layer is formed by an evaporation or inkjet printing process, and the cathode is formed on the organic light emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it can be ensured that external water vapor cannot enter the light emitting structure layer.

In an exemplary implementation mode, the base substrate may be a flexible base substrate, or a rigid base substrate. The rigid substrate may be, but is not limited to, one or more of glass and quartz. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo. The first insulating layer, the second insulating layer, the third insulating layer, the fourth insulating layer, and the fifth insulating layer may be made of any one or more of silicon oxide (SiOx), silicon nitride (SiNx) and silicon oxynitride (SiON), and may be a single layer, a multilayer, or a composite layer. The first insulating layer is called a buffer layer, which is used to improve the water oxygen resistance of the base substrate. The second insulating layer and the third insulating layers are called gate insulating (GI) layers. The fourth insulating layer is called an interlayer insulating (ILD) layer. The planarization layer may be made of an organic material, and the transparent conductive thin film may be made of indium tin oxide (ITO) or indium zinc oxide (IZO). The active layer may be made of polysilicon (p-Si), that is, the present disclosure is applicable to LTPS thin film transistors.

Although the exemplary embodiment shown in FIG. 28*b* has been described by taking the data lines arranged on the third conductive layer and the data fanout lines arranged on the fourth conductive layer as an example for description, in the present disclosure, the data fanout lines and the data lines can be arranged in any layer, as long as it is ensured that data signal lines and data fanout lines are located in the different conductive layers, and this is not limited in the present disclosure.

The structure of the display substrate and its preparation process in the present disclosure are only exemplary description. In an exemplary implementation, variation of corresponding structures and addition or reduction of the patterning process may be performed as practically required, which is not limited in the present disclosure.

In a display substrate, the bonding region is provided with a fanout area, and the data lines of the display region are led out through the data fanout lines of the fanout area. Because there are many oblique lines in a fan area, the lower frame is relative wide, which is not conducive to the realization of a narrow frame. In an exemplary embodiment of the present disclosure, the lead wires are arranged in the lead area of the bonding region, the data fanout lines are arranged in the display region, and the lead wires are connected to the corresponding data lines through the data fanout lines, so that corresponding connection between the plurality of lead wires and the plurality of data lines is implemented, and the oblique lines in a fan area are omitted from the lead area. The plurality of lead wires are vertical lines parallel to each other, which can be directly led into the composite circuit area of the bonding area, effectively reducing the length of the lead area in a vertical direction greatly, greatly reducing the width of the lower border, allowing the widths of the upper boarder, the lower border, the left border, and the right border of the display apparatus to be similar and all below 1.0 mm, increasing a screen-to-body ratio, and facilitating the implementation of full screen display.

In addition, in an embodiment of the present disclosure, by overlapping data fanout lines 700 with some signal lines with fixed potential (a first power supply line 41, a plate connection line 35 and an initial signal line 31, etc.), the potential change on data fanout lines 700 can be prevented from causing the potential jump of other signal lines in the pixel circuit when a data signal is written, thus further improving the display quality.

Figure 29:
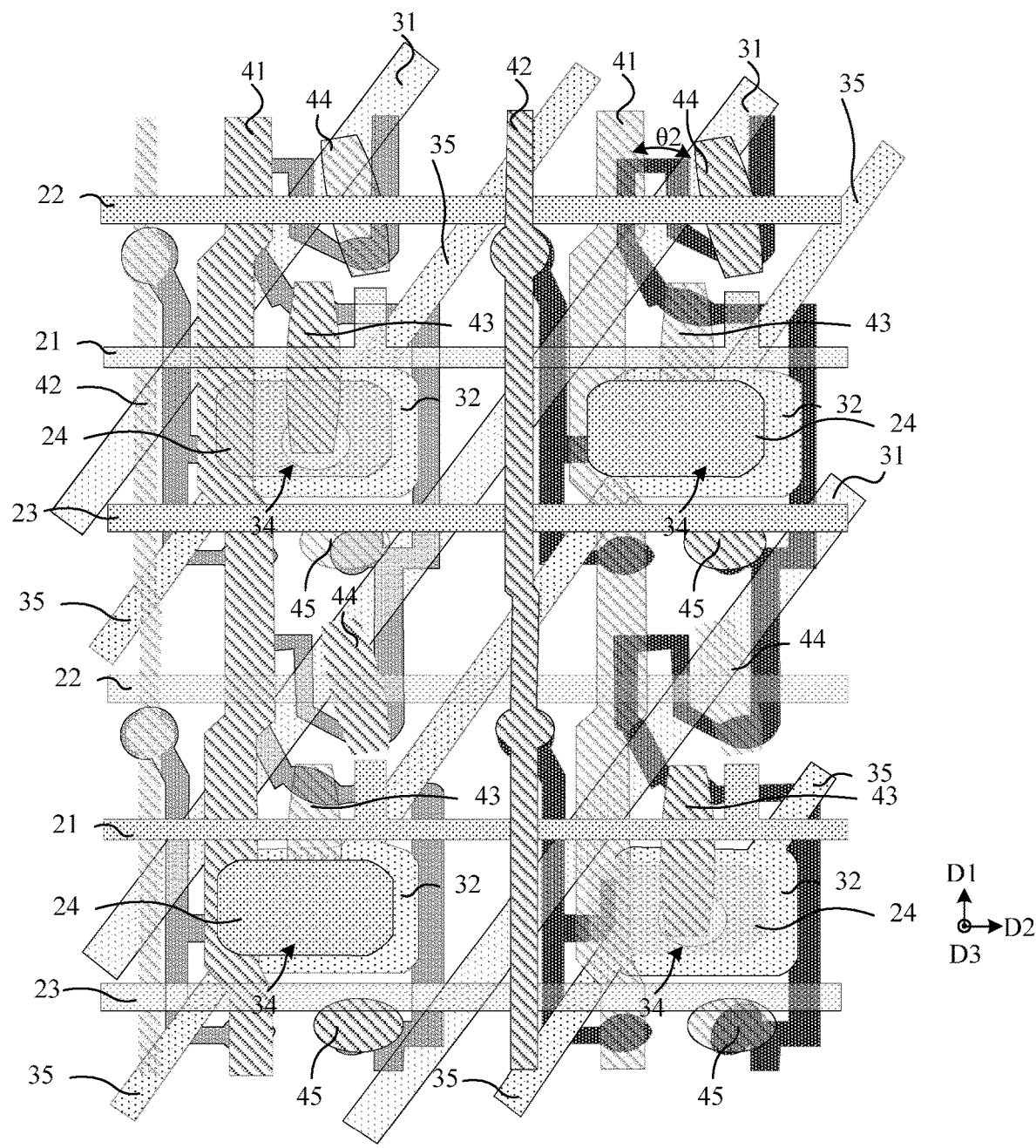
FIG. 29 is a schematic diagram of a plan structure of a display region in a display substrate.

FIG. 29 is a schematic diagram of a structure of another display substrate according to an exemplary embodiment of the present disclosure. As shown in FIG. 29, the display region 100 includes a plurality of plate connection lines 35 and initial signal lines 31. A second included angle $\theta 2$ is formed between the plurality of plate connection lines 35 and initial signal lines 31, and the first direction D1, wherein the second included angle $\theta 2$ may be greater than 0° and less than 90°.

In an exemplary embodiment, the second included angle $\theta 2$ may be about 20° to 70°.

In the embodiment, the lengths of data fanout lines located above plate connection lines 35 and initial signal lines 31 can be reduced by obliquely arranging the plate connection lines 35 and the initial signal lines 31. As shown in FIG. 29, since the plate connection lines 35 and the initial signal lines 31 are arranged in the same layer as a second gate metal layer, the plate connection lines 35 and the initial signal lines 31 are arranged obliquely, which does not affect the arrangement of other film layer signal lines (such as scanning signal lines, emission control lines, reset signal lines, first power supply lines, data lines, etc.).

According to an exemplary embodiment of the present disclosure, the technical effects of the foregoing embodiments can be achieved, including effectively narrowing the lower border and effectively improving display uniformity and display quality. In addition, in the present disclosure, the lengths of data fanout lines located above plate connection lines 35 and initial signal lines 31 are reduced effectively by obliquely arranging the plate connection lines 35 and the initial signal lines 31, which is conducive to lowering the difficulty in wiring design.

In the exemplary embodiment, the film layer structure of the data lines, the data fanout lines, and the lead wires may be similar to that in the foregoing exemplary embodiment, and will not be repeated here.

An exemplary embodiment of the disclosure also provides a preparation method for a display substrate. In an exemplary implementation, the display substrate includes a display region and a bonding region on a side of the display region, the bonding region at least including a lead area; the preparation method may include the following operations: forming a plurality of data lines and a plurality of data fanout lines in the display region, and forming a plurality of lead wires in the lead area, wherein at least one lead wire is connected with a data line through a data fanout line, in a plane perpendicular to the display substrate, the display substrate includes a first conductive layer, a second conductive layer, a third conductive layer and a fourth conductive layer, and insulating layers are arranged between the first conductive layer and the second conductive layer, between the second conductive layer and the third conductive layer, between the third conductive layer and the fourth conductive layer; the data lines and data fanout lines are arranged in different conductive layers.

An exemplary embodiment of the present disclosure further provides a display apparatus, which includes the display substrate in the above embodiments. The display apparatus may be any product or component with a display function, such as a mobile phone, a tablet computer, a television, a display, a notebook computer, a digital photo frame, a navigator, an advertising panel, a smart watch, an E-book portable multimedia player, or a display screen of various products of Internet of Things. In an exemplary implementation, the display apparatus may be a wearable display apparatus, which can be worn on a human body in some manners, such as a smart watch, and a smart bracelet.

The drawings of the present disclosure only involve the structures involved in the present disclosure, and the other structures may refer to conventional designs. The embodiments in the present disclosure, i.e., the features in the embodiments, can be combined without conflicts to obtain new embodiments.

Those of ordinary skill in the art should know that modifications or equivalent replacements may be made to the technical solutions of the present disclosure without departing from the spirit and scope of the technical solutions of the present disclosure, and the modifications or equivalent replacements shall all fall within the scope of the claims of the present disclosure.

The invention claimed is:

1. A display substrate, comprising: a display region and a bonding region on a side of the display region, wherein the bonding region at least comprises a lead area; the display region comprises a plurality of data lines and a plurality of data fanout lines, and the lead area comprises a plurality of lead wires; at least one lead wire is connected to a data line through a data fanout line;
   in a plane perpendicular to the display substrate, the display substrate comprises a first conductive layer, a second conductive layer, a third conductive layer and a fourth conductive layer, and insulating layers are arranged between the first conductive layer and the second conductive layer, between the second conductive layer and the third conductive layer, as well as between the third conductive layer and the fourth conductive layer; and the data lines and the data fanout lines are arranged in different conductive layers,
   wherein the display region further comprises a first power supply line and a plate connection line; the first power supply line extends in a first direction and the plate connection line extends in a second direction; and the second direction crosses the first direction,
   wherein at least one data fanout line comprises a first line segment and a second line segment; a first end of the first line segment is connected to a lead wire, and a second end of the first line segment extends in a direction away from the lead area, and then is connected to a first end of the second line segment; a second end of the second line segment extends in a direction towards the lead area, and then is connected to a data line through a via,
   wherein the second line segment comprises an extending segment and a connecting segment; a first end of the extending segment is located in the display region and is connected to the second end of the first line segment, and a second end of the extending segment extends to an edge of the display region in a direction towards the lead area, and then is connected to a first end of the connecting segment; and a second end of the connecting segment extends in a direction away from the display region, and then is connected to a data line, which extends to the lead area, through a via; and the edge of the display region is an edge, on a side, close to the lead area, of the display region, and
   wherein the extending segment comprises M1 first sub-line segments and M1 second sub-line segments, wherein M1 is a natural number greater than or equal to 1; the first sub-line segments and the second sub-line segments are connected alternately, a first sub-line segment located at one side of the extending segment is connected with the first line segment, and a second sub-line segment located at the other side of the extending segment is connected with the connecting segment; orthographic projections of the first line segment and the second sub-line segment on the display substrate plane both overlap with an orthographic projection of the first power supply line on the display substrate plane, and an orthographic projection of the first sub-line segment on the display substrate plane overlaps with an orthographic projection of the plate connection line on the display substrate plane.

2. The display substrate according to claim 1, wherein the first line segment is parallel to the first direction, a first included angle is formed between the second line segment and the first direction, and the first included angle is 20° to 70°.

3. A display apparatus, comprising the display substrate of claim 2.

4. The display substrate according to claim 1, wherein a second included angle is formed between the plate connection line and the first direction, and the second included angle is 20° to 70°.

5. The display substrate according to claim 4, wherein the plate connection line is located in the second conductive layer, the first power supply line is located in the third conductive layer, and the data fanout line is located in the fourth conductive layer.

6. The display substrate according to claim 1, wherein the plate connection line is located in the second conductive layer, the first power supply line is located in the third conductive layer, and the data fanout line is located in the fourth conductive layer.

7. The display substrate according to claim 1, wherein the display region further comprises an initial signal line, the initial signal line is extended in the second direction; and
    an orthographic projection of the first sub-line segment on the display substrate plane overlaps with an orthographic projection, on the display substrate plane, of the initial signal line.

8. The display substrate according to claim 7, wherein the initial signal line and the plate connection line are both located in the second conductive layer, the first power supply line is located in the third conductive layer, and the data fanout line is located in the fourth conductive layer.

9. The display substrate according to claim 1, wherein the display region further comprises an initial signal line, a second included angle is formed between the initial signal line and the first direction and between the plate connection line and the first direction; and the second included angle is 20° to 70°; and an orthographic projection of the first sub-line segment on the display substrate plane overlaps with an orthographic projection, on the display substrate plane, of the initial signal line.

10. The display substrate according to claim 9, wherein the initial signal line and the plate connection line are both located in the second conductive layer, the first power supply line is located in the third conductive layer, and the data fanout line is located in the fourth conductive layer.

11. The display substrate according to claim 1, the plurality of lead wires in the lead region have the same width in the second direction, and a spacing between adjacent lead wires in the second direction is the same.

12. The display substrate according to claim 11, wherein the plurality of lead wires of the lead area comprise a first lead group and a second lead group, and lead wires of the first lead group and lead wires of the second lead group are arranged alternately in the second direction;
    a plurality of lead wires in the first lead group are connected with data lines correspondingly through a plurality of the data fanout lines, and a plurality of lead wires in the second lead group are connected directly with data lines correspondingly.

13. A display apparatus, comprising the display substrate of claim 1.

14. A preparation method for a display substrate, the display substrate comprising a display region and a bonding region on a side of the display region, the bonding region at least comprising a lead area; wherein the preparation method comprises:

forming a plurality of data lines and a plurality of data fanout lines in the display region, and forming a plurality of lead wires in the lead area; wherein at least one lead wire is connected with a data line through a data fanout line; in a plane perpendicular to the display substrate, the display substrate comprises a first conductive layer, a second conductive layer, a third conductive layer and a fourth conductive layer, and insulating layers are arranged between the first conductive layer and the second conductive layer, between the second conductive layer and the third conductive layer, as well as between the third conductive layer and the fourth conductive layer; the data lines and data fanout lines are arranged in different conductive layers, wherein the display region further comprises a first power supply line and a plate connection line; the first power supply line extends in a first direction and the plate connection line extends in a second direction; and the second direction crosses the first direction, wherein at least one data fanout line comprises a first line segment and a second line segment; a first end of the first line segment is connected to a lead wire, and a second end of the first line segment extends in a direction away from the lead area, and then is connected to a first end of the second line segment; a second end of the second line segment extends in a direction towards the lead area, and then is connected to a data line through a via, wherein the second line segment comprises an extending segment and a connecting segment; a first end of the extending segment is located in the display region and is connected to the second end of the first line segment, and a second end of the extending segment extends to an edge of the display region in a direction towards the lead area, and then is connected to a first end of the connecting segment; and a second end of the connecting segment extends in a direction away from the display region, and then is connected to a data line, which extends to the lead area, through a via; and the edge of the display region is an edge, on a side, close to the lead area, of the display region, and wherein the extending segment comprises M1 first sub-line segments and M1 second sub-line segments, wherein M1 is a natural number greater than or equal to 1; the first sub-line segments and the second sub-line segments are connected alternately, a first sub-line segment located at one side of the extending segment is connected with the first line segment, and a second sub-line segment located at the other side of the extending segment is connected with the connecting segment; orthographic projections of the first line segment and the second sub-line segment on the display substrate plane both overlap with an orthographic projection of the first power supply line on the display substrate plane, and an orthographic projection of the first sub-line segment on the display substrate plane overlaps with an orthographic projection of the plate connection line on the display substrate plane.

* * * * *